US006990646B2

(12) United States Patent
Yoshikawa

(10) Patent No.: US 6,990,646 B2
(45) Date of Patent: Jan. 24, 2006

(54) HOLD TIME ERROR CORRECTION METHOD AND CORRECTION PROGRAM FOR INTEGRATED CIRCUITS

(75) Inventor: Satoru Yoshikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 433 days.

(21) Appl. No.: 10/270,111

(22) Filed: Oct. 15, 2002

(65) Prior Publication Data

US 2003/0101399 A1 May 29, 2003

(30) Foreign Application Priority Data

Nov. 26, 2001 (JP) .............................. 2001-359399

(51) Int. Cl.
*G06F 17/50* (2006.01)
(52) U.S. Cl. ............................................. 716/6; 716/8
(58) Field of Classification Search .................... 716/2, 716/4, 6, 8; 364/491
See application file for complete search history.

(56) References Cited

U.S. PATENT DOCUMENTS 6,311,148 B1 * 10/2001 Krishnamoorthy ........... 703/19
6,434,727 B1 * 8/2002 Ishii et al. ...................... 716/6
6,546,531 B1 * 4/2003 Quach et al. ................... 716/6
6,557,150 B1 * 4/2003 Honmura et al. ............... 716/6
6,594,805 B1 * 7/2003 Tetelbaum et al. ............. 716/5
6,640,330 B1 * 10/2003 Joshi ............................. 716/9
6,732,066 B2 * 5/2004 Krishnamoorthy ........... 703/14
6,745,376 B2 * 6/2004 Fredrickson ................... 716/6
2001/0007144 A1 * 7/2001 Terazawa ....................... 716/6
2002/0166101 A1 * 11/2002 Casavant ....................... 716/6

* cited by examiner

*Primary Examiner*—Stacy A. Whitmore
(74) *Attorney, Agent, or Firm*—Staas & Halsey LLP

(57) ABSTRACT

A hold time error list, having for each hold time error path a hold time error value satisfying plural timing constraints, and more specifically a maximum hold time error value for each of timing constraints, as well as a setup time margin map allocating to path a setup time margin satisfying plural timing constraints for each setup time error path, and more specifically minimum value of setup time margins for the same path for each timing constraint, are generated. Also, referring to this setup time margin map, delay buffers, which reduces or eliminates hold time error of hold error list, and a delay of which is within the range of delay amounts and positions equal to or lower than the setup time margin, are inserted. Referring to the setup time margin map, it is possible to insert delay buffer to correct hold time error without causing new setup time errors.

23 Claims, 20 Drawing Sheets

FIG. 10

HOLD TIME ERROR LIST (A)  HOLD ERROR LIST FOR TC1

| Path | HoldError |
|---|---|
| FF1(CK->Q)->A->B->C->D->Gate(A1->X)->I->J->K->FF2.D | -25ps |
| FF1(CK->Q)->A->B->C->D->Gate(A2->X)->I->L->M->FF4.D | -100ps |

(B)  HOLD ERROR LIST FOR TC2

| Path | HoldError |
|---|---|
| FF1(CK->Q)->A->B->C->D->Gate(A1->X)->I->J->K->FF2.D | -10ps |
| FF3(CK->Q)->E->F->G->H->Gate(A2->X)->I->L->M->FF4.D | -100ps |

(C)  COMBINED HOLD ERROR LIST  (F14)

| Path | HoldError |
|---|---|
| FF1(CK->Q)->A->B->C->D->Gate(A1->X)->I->J->K->FF2.D | -25ps |
| FF1(CK->Q)->A->B->C->D->Gate(A2->X)->I->L->M->FF4.D | -100ps |
| FF3(CK->Q)->E->F->G->H->Gate(A2->X)->I->L->M->FF4.D | -100ps |

FIG. 11

SETUP TIME MARGIN LIST (A)  EXTRACTED RELATED PATHS   (F16)
  Path
  FF1(CK->Q)->A->B->C->D->Gate(A1->X)->I->J->K->FF2.D
  FF1(CK->Q)->A->B->C->D->Gate(A2->X)->I->L->M->FF4.D
  FF3(CK->Q)->E->F->G->H->Gate(A2->X)->I->L->M->FF4.D
  FF3(CK->Q)->E->F->G->H->Gate(A2->X)->I->J->K->FF2.D (B)  SETUP MARGIN LIST FOR TC1
  Path                                                                    Setup margin
  FF1(CK->Q)->A->B->C->D->Gate(A1->X)->I->J->K->FF2.D        500ps
  FF1(CK->Q)->A->B->C->D->Gate(A2->X)->I->L->M->FF4.D        200ps
  FF3(CK->Q)->E->F->G->H->Gate(A2->X)->I->L->M->FF4.D        300ps
  FF3(CK->Q)->E->F->G->H->Gate(A2->X)->I->J->K->FF2.D        700ps (C)  SETUP MARGIN LIST FOR TC2
  Path                                                                    Setup margin
  FF1(CK->Q)->A->B->C->D->Gate(A1->X)->I->J->K->FF2.D        600ps
  FF1(CK->Q)->A->B->C->D->Gate(A2->X)->I->L->M->FF4.D        200ps
  FF3(CK->Q)->E->F->G->H->Gate(A2->X)->I->L->M->FF4.D        300ps
  FF3(CK->Q)->E->F->G->H->Gate(A2->X)->I->J->K->FF2.D        400ps (D)  COMBINED SETUP MARGIN LIST   (F18)
  Path                                                                    Setup margin
  FF1(CK->Q)->A->B->C->D->Gate(A1->X)->I->J->K->FF2.D        500ps
  FF1(CK->Q)->A->B->C->D->Gate(A2->X)->I->L->M->FF4.D        200ps
  FF3(CK->Q)->E->F->G->H->Gate(A2->X)->I->L->M->FF4.D        300ps
  FF3(CK->Q)->E->F->G->H->Gate(A2->X)->I->J->K->FF2.D        400ps (E)  SETUP MARGIN LIST BETWEEN FFs   (F18)

FF1 -> FF2 = 500ps
      -> FF4 = 200ps
  FF3 -> FF2 = 400ps
      -> FF4 = 300ps

SETUP MARGIN MAP WHEN SETUP MARGIN 500 IS ALLOCATED TO PATH FF1-FF2

SETUP MARGIN MAP WHEN SETUP MARGIN 300 IS ALLOCATED TO PATH FF3-FF4

SETUP MARGIN MAP WHEN SETUP MARGIN 200,400 ARE ALLOCATED TO PATH FF1-FF4 AND FF3-FF2

F20

SETUP MARGIN MAP WHEN CELL N IS INSERTED TO CORRECT 100ps HOLD ERROR OF TO PATH FF1-FF4 AND FF3-FF2

UPDATED SETUP MARGIN MAP (F20)

(A) SETUP MARGIN LIST (F18) AFTER UPDATED

FF1 -> FF2 = 500ps
    -> FF4 = 50ps
FF3 -> FF2 = 400ps
    -> FF4 = 150ps (B) COMBINED HOLD ERROR LIST (F14) AFTER UPDATED

| Path | Hold Error |
|---|---|
| FF1(CK->Q)->A->B->C->D->Gate(A1->X)->I->J->K->FF2.D | −25ps |
| FF1(CK->Q)->A->B->C->D->Gate(A2->X)->I->L->M->FF4.D | 0ps |
| FF3(CK->Q)->E->F->G->H->Gate(A2->X)->I->L->M->FF4.D | −100ps |

SETUP MARGIN MAP WHEN CELL P IS INSERTED TO CORRECT -100ps HOLD ERROR OF TO PATH FF3-FF4

SETUP MARGIN MAP (F20) AFTER UPDATED (A) SETUP MARGIN LIST (F18) AFTER UPDATED

FF1 -> FF2 = 500ps
   -> FF4 = 50ps
FF3 -> FF2 = 250ps
   -> FF4 =   0ps (B) COMBINED HOLD ERROR LIST (F14) AFTER UPDATED

| Path | Hold Error |
|---|---|
| FF1(CK->Q)->A->B->C->D->Gate(A1->X)->I->J->K->FF2.D | −25ps |
| FF1(CK->Q)->A->B->C->D->Gate(A2->X)->I->L->M->FF4.D | 0ps |
| FF3(CK->Q)->E->F->G->H->Gate(A2->X)->I->L->M->FF4.D | 0ps |

SETUP MARGIN MAP WHEN CELL Q IS INSERTED TO CORRECT −25ps HOLD ERROR OF THE PATH FF1-FF2

SETUP MARGIN MAP (F20) AFTER UPDATED

HOLD ERROR LIST AT RISING AND FALLING EDGES

| Path | Hold Error | |
|---|---|---|
| | Up | Down |
| FF1(CK->Q)->A->B->C->D->Gate(A1->X)->I->J->K->FF2.D | -25ps | -30ps |
| FF1(CK->Q)->A->B->C->D->Gate(A2->X)->I->L->M->FF4.D | -100ps | -90ps |
| FF3(CK->Q)->E->F->G->H->Gate(A2->X)->I->L->M->FF4.D | -100ps | -80ps |

VA,VB,VC : VIRTUAL CELLS (VIRTUAL SETUP MARGIN SET POINT)

HOLD TIME ERROR CORRECTION METHOD AND CORRECTION PROGRAM FOR INTEGRATED CIRCUITS

BACKGROUND OF THE INVENTION

1. Field of the Invention

This invention relates to a method for correction of hold time errors for LSI logic circuits (integrated circuits) and a program for same, and in particular relates to a hold time error correction method and program which satisfies all of a plurality of timing constraints corresponding to a plurality of operating modes. Moreover, this invention provides a layout method and program which do not generate timing errors under a plurality of timing constraints. The hold time error is sometimes called as a hold time violation. In this specification, "hold time error" or "hold error" is commonly used as the hold time violation.

2. Description of the Related Art

As the logic circuitry within semiconductor integrated circuit chips has increased in scale and moved to higher speeds, it has become increasingly difficult to perform layout while checking signal timing. Conventional layout tools are programs which perform layout of logic circuits on a computer; based on the logic data of a logic circuit the logic design of which has been completed, the cells and macros comprising the logic circuit are arranged on the chip, and a post-layout netlist is generated. Layout tools normally incorporate static timing analysis (STA) tools, so that layout which takes signal timing into account can be performed.

The signal static timing includes the setup time, which indicates how far ahead of the clock the supplied data should be set up, and the hold time, which indicates how long after the clock the supplied data should be held. Both the setup time and the hold time constraints must be satisfied.

FIG. 1 is a figure explaining the above setup time and hold time. The flip-flop shown in FIG. 1A reads the supplied data DATA on the rising edge of the clock pulse CLK, and outputs the data from the output Q. In order to appropriately read the data DATA in response to the clock CLK, the data DATA must be finalized earlier than the timing of the clock CLK by at least the length of the setup time, and must be held until after the hold time.

FIG. 1B shows the setup time; the setup time ST is the time between the moment of finalization of the data DATA and the rising edge of the clock signal CLK, and is required to be at least the setup time determined by the flip-flop characteristic. FIG. 1C shows the hold time. The hold time is the time between the rising edge of the clock signal CLK and the end of the data DATA, and is also required to be at least the hold time determined by the flip-flop characteristic.

The earlier the finalization of the data DATA, the more easily the setup time ST requirement can be met. After layout of the logic circuit, however, it is difficult to advance the timing of the data DATA. On the other hand, the later the end of the data DATA, the more easily the hold time HT requirement can be met; but even after completion of the logic circuit layout, it is easily to delay this timing by inserting a delay buffer.

The circuit delay characteristics will differ depending on the LSI process conditions, power supply voltage, and operating temperature. For example, if the process conditions fluctuate toward poorer conditions (characteristics become slower), the power supply voltage fluctuates toward lower voltages, and the operating temperature fluctuates toward higher temperatures, then the circuit delay will increase, and operating speed will be slowed. This is called the MAX (or maximum) side delay characteristic. Conversely, if the process conditions fluctuate toward better conditions (characteristics become faster), the power supply voltage fluctuates toward higher voltages, and the operating temperature fluctuates toward lower temperatures, then the circuit delay is reduced, and the operating speed increases. This shall be called the MIN (or minimum) side delay characteristic.

In setup time analysis, if analysis is performed using the MAX side delay characteristic, a check can be performed to determine whether setup time errors (or violations) occur; but in hold time analyses, in addition to the MIN side delay characteristic, analysis using the MAX side delay characteristic is also necessary. This is because a reversal phenomenon may occur between the hold time for MAX-side delay characteristics and the hold time for MIN-side delay characteristics, along signal paths where cells dominate and signal paths where wiring dominates.

If the above setup time requirement is not satisfied, a setup time error or violation (hereafter simply "setup error") occurs, and if the hold time requirement is not satisfied, a hold time error or violation (hereafter simply "hold error") occurs. When performing layout of a large-scale integrated circuit, cells and macros must be arranged so as to satisfy these timing requirements.

Conventional layout tools incorporate a static timing analysis (STA) tool which analyzes the setup time and hold time, and determines whether setup errors or hold errors have occurred, so as to perform layout which takes these timing requirements into consideration.

On the other hand, in some cases the integrated circuit has a plurality of timing constraints corresponding to a plurality of operating modes. Timing constraints mean constraints in which, for example, in a given operating mode two types of clock CLK1, CLK2 (at respective frequencies F1, F2) are used as control clocks, and in another operating mode, one type of clock CLK1 and its inverted clock /CLK1 (at frequency F3) are used as control clocks. In other words, in some cases the types of clocks used differ depending on the operating mode, and moreover the clock frequencies differ as well. Hence in integrated circuit layout, it is necessary that the above timing requirements be satisfied given a plurality of timing constraints corresponding to this plurality of operating modes.

As explained above, conventional layout tools incorporate a static timing analysis (STA) tool to perform layout, taking into account signal timing for one type of timing constraint (operating mode). It is difficult to modify the layout to advance the timing after the layout is completed. Hence in layout tools, layout of cells is performed such that setup errors do not occur, and then, after layout, the integrated circuit is checked for hold errors, and delay buffers are inserted into signal paths causing hold errors to correct the hold errors.

However, this hold error correction has the following problems. First, if a delay buffer is inserted in order to correct a hold error, a hold error for one type of timing constraint inputted to the layout tool is corrected; but if timing analysis is performed for another timing constraint, a new setup error may occur for the signal path. Once a setup error occurs, correction of the setup error is difficult, nor is it an easy matter to decide where a delay buffer should be inserted.

FIG. 2 explains the above problem. FIG. 2A is a circuit example, having four flip-flops FF1 to FF4 and an AND gate AND. In FIG. 2B, the timing chart is shown. Along the signal path from the flip-flop FF3 to the AND gate and then to the flip-flop FF2, the output data Q3 is outputted in response to the rising edge of the clock CK3, and supplied as the input data D2 to the flip-flop FF2. Along the signal path from the flip-flop FF1 to the flip-flop FF2, the output data Q1 is outputted in response to the rising edge of the clock CK1 and supplied as the input data D2 to the flip-flop FF2. If the change in the Q3-D2 signal and the change in the Q1-D2 signal are assumed to be as shown, then the setup time ST and hold time HT for the flip-flop FF2 with respect to the clock CK2 are as shown.

In the layout process, layout is performed so as to satisfy the setup time ST requirement; suppose that, as a result, the hold time HT is too short and a hold error occurs. In this case, suppose that a delay buffer is inserted between the AND gate and the flip-flop FF2, delaying the Q1-D2 signal, lengthening the hold time HT and correcting the hold error. As a result, signals on a signal path which share the signal path into which the delay buffer was inserted are also delayed, so that for example in the case of the Q3-D2 signal, the setup time ST is shortened, possibly causing a setup error. If a delay buffer is inserted between the flip-flop FF1 and the AND gate, the Q1-D4 signal is also affected, and in similar fashion a setup error may occur.

As a second problem, in the case of a plurality of timing constraints corresponding to a plurality of operating modes, the hold times and setup times will be different, and correction of hold errors so as to satisfy all these conditions becomes extremely complicated. As a result, automatic correction of hold errors by computer is no longer possible, and ordinarily manual correction is performed by a skilled designer.

In this way, when correcting timing errors, if layout is performed with priority given to the setup time and hold errors are then corrected, there is no method for inserting delay buffers without causing new setup errors, nor is there a method for inserting delay buffers to correct a hold error for a given timing constraint while preventing the occurrence of new setup errors under different timing constraints, and so the automatic correction of hold errors by a computer has been impossible.

SUMMARY OF THE INVENTION

One object of this invention is to provide a hold time error correction method and program which simultaneously satisfy a plurality of timing constraints in an integrated circuit.

Another object of this invention is to provide a layout method and program which simultaneously satisfy a plurality of timing constraints in an integrated circuit.

In order to achieve the above objects, one aspect of this invention is a hold error correction method for integrated circuits, having:

a procedure of generating, for an integrated circuit layout, a hold time error list that includes path (hereafter "hold time error path") causing hold time error which exists under a plurality of timing constraints, and hold time error value for each of the hold time error path which satisfies said plurality of timing constraints as a result of correction;

a procedure of detecting setup time margin for said plurality of timing constraints, and generating a setup time margin list having path (hereafter "setup time error path") with the possibility of causing setup time error as a result of correction of said hold time error, and setup margin for each of the setup time error path which is common for said plurality of timing constraints;

a procedure of generating a setup margin map, in which the setup time margin of said setup time margin list is allocated to each path of said integrated circuit; and, a delay buffer insertion procedure of, while referencing said setup time margin map, inserting delay buffer which corrects the hold time error value of said hold time error list, within the range of delay amount and position which satisfy said allocated setup time margin.

According to the above invention, a hold time error list, having for each hold time error path a hold time error value satisfying a plurality of timing constraints, and more specifically a maximum hold time error value for each of the timing constraints, as well as a setup time margin map which allocates to path on the integrated circuit a setup time margin satisfying a plurality of timing constraints for each setup time error path, and more specifically minimum value of setup time margins for the same path for each timing constraint, are generated. Also, referring to this setup time margin map, delay buffer, which reduces or eliminates the hold time error of the hold error list, and a delay of which is within the range of delay amounts and positions equal to or lower than the setup time margin, are inserted. By referring to the setup time margin map, it is possible to insert delay buffer to correct the hold time error without causing new setup time errors.

In a preferred embodiment, a plurality of delay buffers are inserted, and each time one delay buffer is inserted, the setup time margin within the setup margin map is updated according to the delay amount and position of the delay buffer; when inserting the next delay buffer, this updated setup time margin map is referenced. That is, the delay amount is subtracted from the setup time margin of the path in which the delay buffer is inserted, to update the setup time margin map. By this means, a plurality of delay buffers can be inserted in sequence within the ranges of the setup time margin in the setup margin map, so that a plurality of delay buffers can be inserted without causing any new setup time errors.

In the above embodiment, it is desirable that the delay values to be subtracted are the delay amounts of the inserted delay buffers under a low-speed operating condition. This is because normally the setup time margin is determined using the delay amounts for the cells and wiring included in the integrated circuit under the low-speed operating condition; hence in updating the setup time margin map also, delay amounts under the same condition must be subtracted.

In another preferred embodiment, in the procedure to generate the setup time margin list, paths which may cause setup time error upon insertion of a delay buffer in order to correct a hold time error are extracted from the hold time error list as setup time error paths, and the above setup time margin is extracted for these setup time error paths. Extraction of paths which may cause setup time error may be performed by, for example, extracting paths at least a portion of which is common with a hold time error path, or by extracting paths having a setup time margin which is equal to or lower than the maximum hold time error value. Or, paths satisfying both the above requirements may be extracted.

In still another preferred embodiment, the hold time error list has a hold time error list under a low-speed operating condition of the integrated circuit and a hold time error list under a high-speed operating condition, and in the delay buffer insertion procedure, delay buffers are inserted so as to eliminate hold time error values in both the hold time error lists. Even if hold time errors are eliminated under low-speed operating condition, there is the possibility that hold time errors may occur on other paths under high-speed operating condition, and so it is desirable that such hold time errors also be eliminated.

In another preferred embodiment, the position to which setup time margin is allocated on setup time error path is the position of cells existing on the path. Further, if no cells exist on the path, a virtual point is set, and the setup time margin is allocated to the virtual point.

In order to achieve the above objects, a second aspect of the invention is a layout method for an integrated circuit, comprising:

a procedure to perform layout of the cells and wiring included in the integrated circuit, so as to satisfy setup time requirements under the most strict timing constraints among a plurality of timing constraints;

a procedure of generating, for an integrated circuit layout, a hold time error list that includes path (hereafter "hold time error path") causing hold time error which exists under a plurality of timing constraints, and hold time error value for each of the hold time error path which satisfies said plurality of timing constraints as a result of correction;

a procedure of detecting setup time margin for said plurality of timing constraints, and generating a setup time margin list having path (hereafter "setup time error path") with the possibility of causing setup time error as a result of correction of said hold time error, and setup margin for each of the setup time error path which is common for said plurality of timing constraints;

a procedure of generating a setup margin map, in which the setup time margin of said setup time margin list is allocated to each path of said integrated circuit; and, a delay buffer insertion procedure of, while referencing said setup time margin map, inserting delay buffer which corrects the hold time error value of said hold time error list, within the range of delay amount and position which satisfy said allocated setup time margin.

By means of the above layout method, in addition to the merit of the above-described hold time error correction method, it is judged whether setup time margin requirements are satisfied or not, in a state in which delay buffers are laid out by the delay buffer insertion procedure, so that the occurrence of setup time errors can be avoided more appropriately.

BRIEF DESCRIPTION OF THE DRAWINGS

FIG. 10 is a figure showing the hold error list for the circuit example of FIG. 9;

FIG. 11 is a figure showing the setup margin list for the circuit example of FIG. 9;

DESCRIPTION OF THE PREFERRED EMBODIMENTS

Figure 1A:
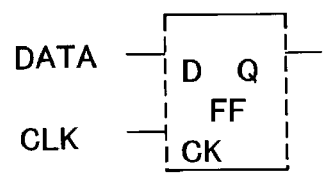
FIG. 1 is a figure which explains setup time and hold time.
Figure 1B:
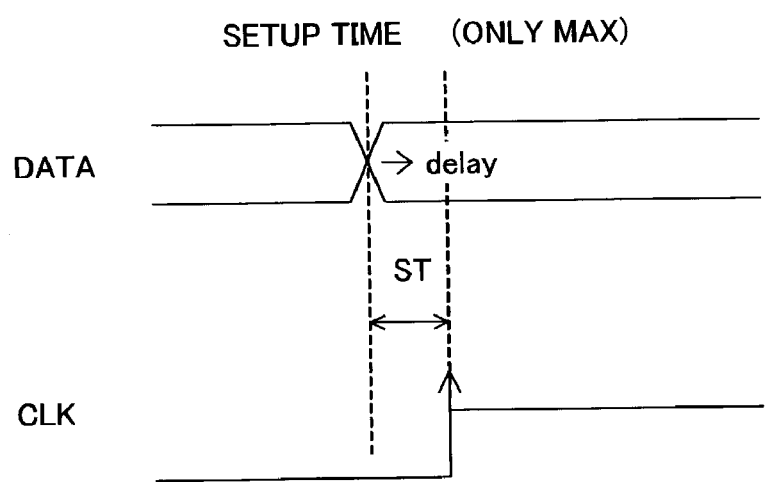
Figure 1C:
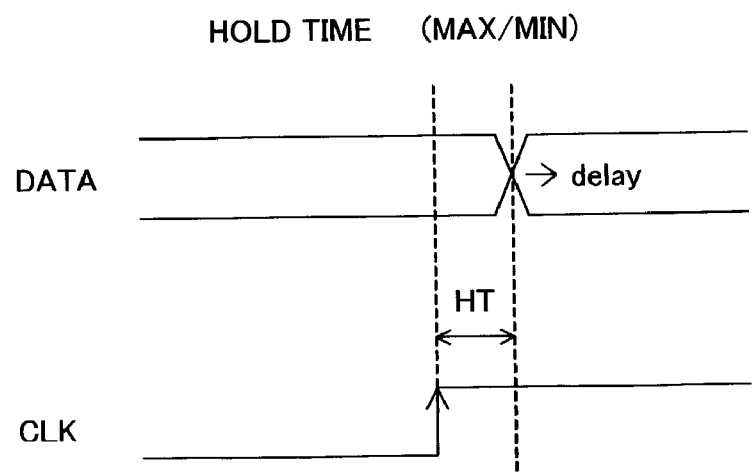

Below, preferred embodiments of the invention are explained, referring to the drawings. However the scope of protection of this invention is not limited to the following embodiments, but extends to inventions described in the claims and their equivalents.

Layout System and Layout Process

Figure 3:
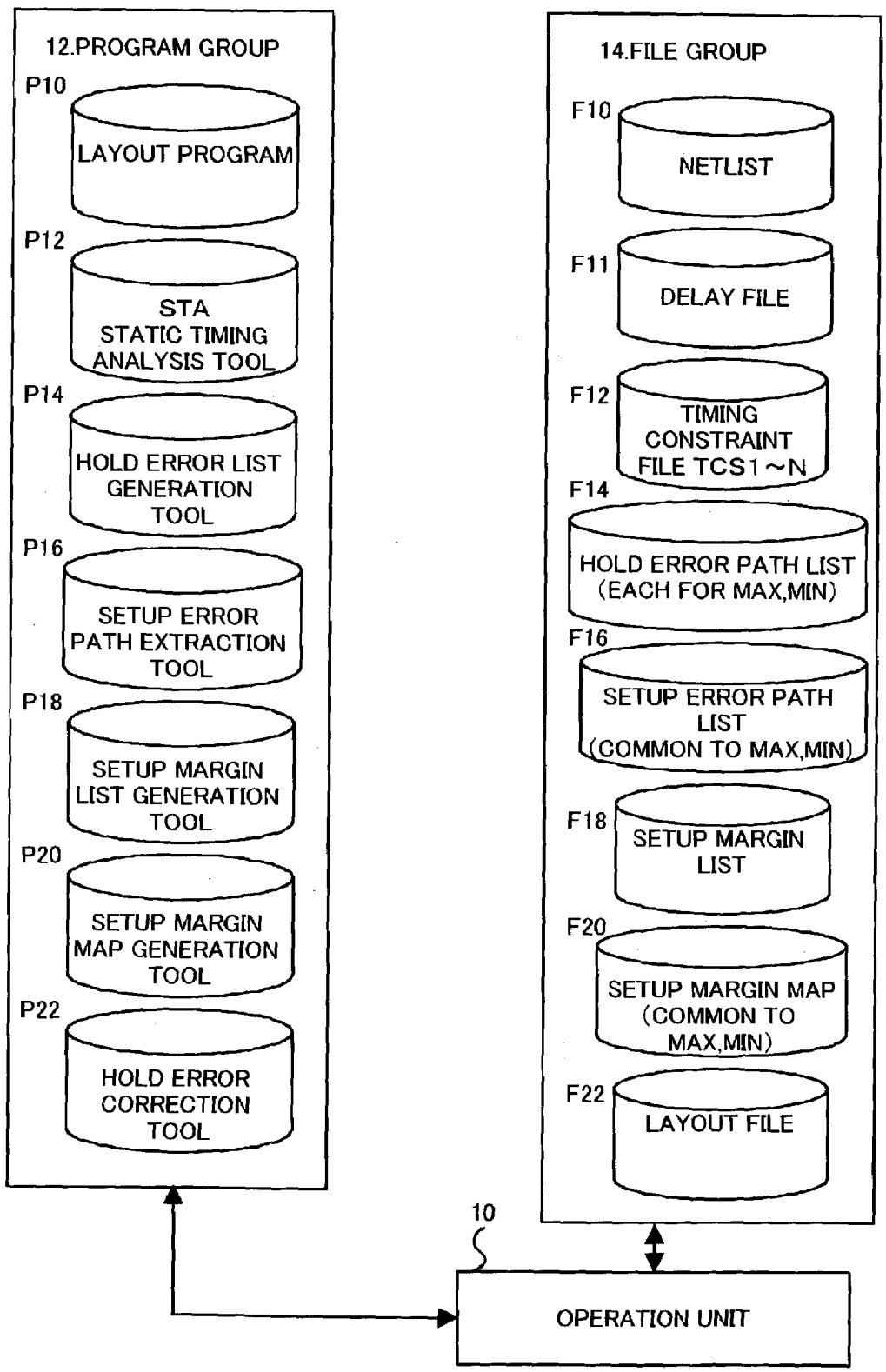
FIG. 3 shows the configuration of the layout system in one embodiment of the invention.

FIG. 3 shows the configuration of the layout system in one embodiment of the invention. The layout system is constituted by an operation unit 10, program group 12, and file group 14. The program group 12 has: (1) a layout program P10, to perform layout of the cells and wiring contained in the netlist F10 of a logic circuit for which logic design has been performed; (2) a static timing analysis (STA) tool P12, which references the netlist F10 and the delay file F11 with cell and wiring delay characteristics, and extracts setup times and hold times based on prescribed timing constraints (F12); (3) a hold error list generation tool P14 which creates a hold error list F14 having paths (hold error paths) which generate hold errors not satisfying the value required by specifications for the hold times of the integrated circuit after layout, and the hold error values (values indicating the extent of the deficiency); (4) a setup error path extraction tool P16, which extracts a list F16 of paths (setup error paths) in which setup errors may be generated as a result of hold error correction; (5) a tool P18 to create a setup margin list F18, having setup margins (values indicating the margin with respect to the setup time required by specifications) for setup error paths; (6) a tool P20 which creates a setup margin map F20, in which the setup margins of the setup margin list are allocated to each setup margin path before and after cells on paths in the integrated circuit; and, (7) a hold error correction tool P22 which inserts delay buffers in order to correct hold errors of the hold error list F14, so as not to cause new setup errors.

By appropriately executing this program group, the operation unit 10 performs layout on the chip of the logic circuit, logic design of which has been performed, and automatically performs necessary corrections of timing errors, including hold error corrections.

Figure 4:
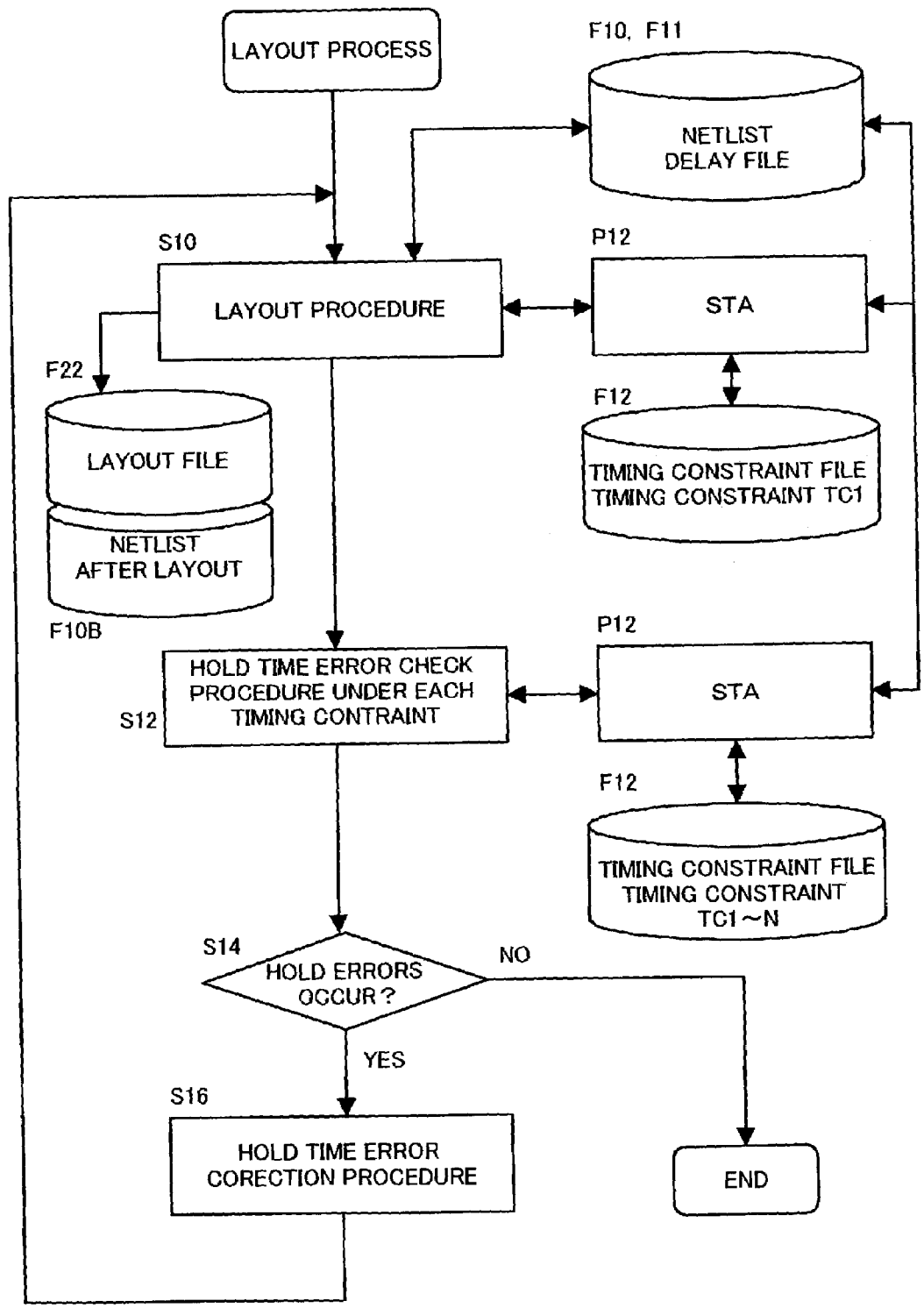
FIG. 4 is a flowchart of the first layout process in the embodiment.

FIG. 4 is a flowchart of the first layout process of the embodiment. In this layout process, first a layout procedure S10 is performed, in which the cells and wiring in the netlist F10 resulting from the completed logic design are arranged on the chip. In this layout procedure, the cells and wiring of the logic circuit are arranged on the chip according to an automated layout algorithm or to layout instructions from an operator, and a layout file F22 is generated. The integrated circuit is required to satisfy timing constraints corresponding to a plurality of operating modes. However, in order to simplify the processing of the layout procedure S10, in this example a check of setup times and a check of hold times are performed using the single most strict timing constraint TC1 for setup time among a plurality of timing constraints.

In the layout procedure, the STA tool is operated in the background, and checks are continually performed to determine whether setup errors occur in the cell and wiring layout. Hence when determining the layout of a given cell or wiring, if a setup error occurs, that layout is prohibited, and another layout is requested. Also, setup error checks are performed according to the delay values of the MAX delay characteristics in the delay file F11. This is because the delay value of the MAX delay characteristic is a stricter condition for setup errors.

In the layout procedure S10, a layout which causes no setup errors is subjected to a check for hold errors given a timing constraint TC1, and delay buffers are inserted in order to correct these hold errors. These are hold errors for one type of timing constraint TC1, and so insertion of the delay buffer necessary for the correction thereof is comparatively simple. As a result, layout is completed with no timing errors with respect only to the timing constraint TC1. Hence the output of the layout procedure S10 is a layout file F22 and a netlist F10B for a layout modified by insertion of delay buffers.

Next, a procedure S12 is performed to check for hold errors under a plurality of timing constraints. By executing the STA tool for each timing constraint, it is possible to detect whether hold time errors are caused, and the magnitude of the error value. In a preferred embodiment, checks of hold errors are performed for both the delay value of the MIN delay characteristic and the delay value of the MAX delay characteristic in the delay file F11. Or, hold error checks may be performed only for the delay values of MIN delay characteristics, for which hold error occurrence is more frequent.

If no hold errors occur (S14), the layout procedure ends; if however there is a hold error (S14), the hold time error correction procedure S16 is performed. This hold time error correction procedure S16 is the method for correction of hold errors according to the present embodiment. The details are described below, but in brief terms, in this correction processing, a delay buffer is inserted into a path in which a hold error occurs, to eliminate the hold error. In this case, a setup margin map is created, and by referring to this map, the delay buffer can be inserted without new setup errors occurring.

When hold error correction is completed, layout is performed once again using the layout procedure S10 for the newly inserted delay buffers, and a hold error check (S12) is performed according to the delay characteristics after the layout completion. If errors still occur, further delay buffers are inserted, or the layout positions of the delay buffers are modified.

Figure 5:
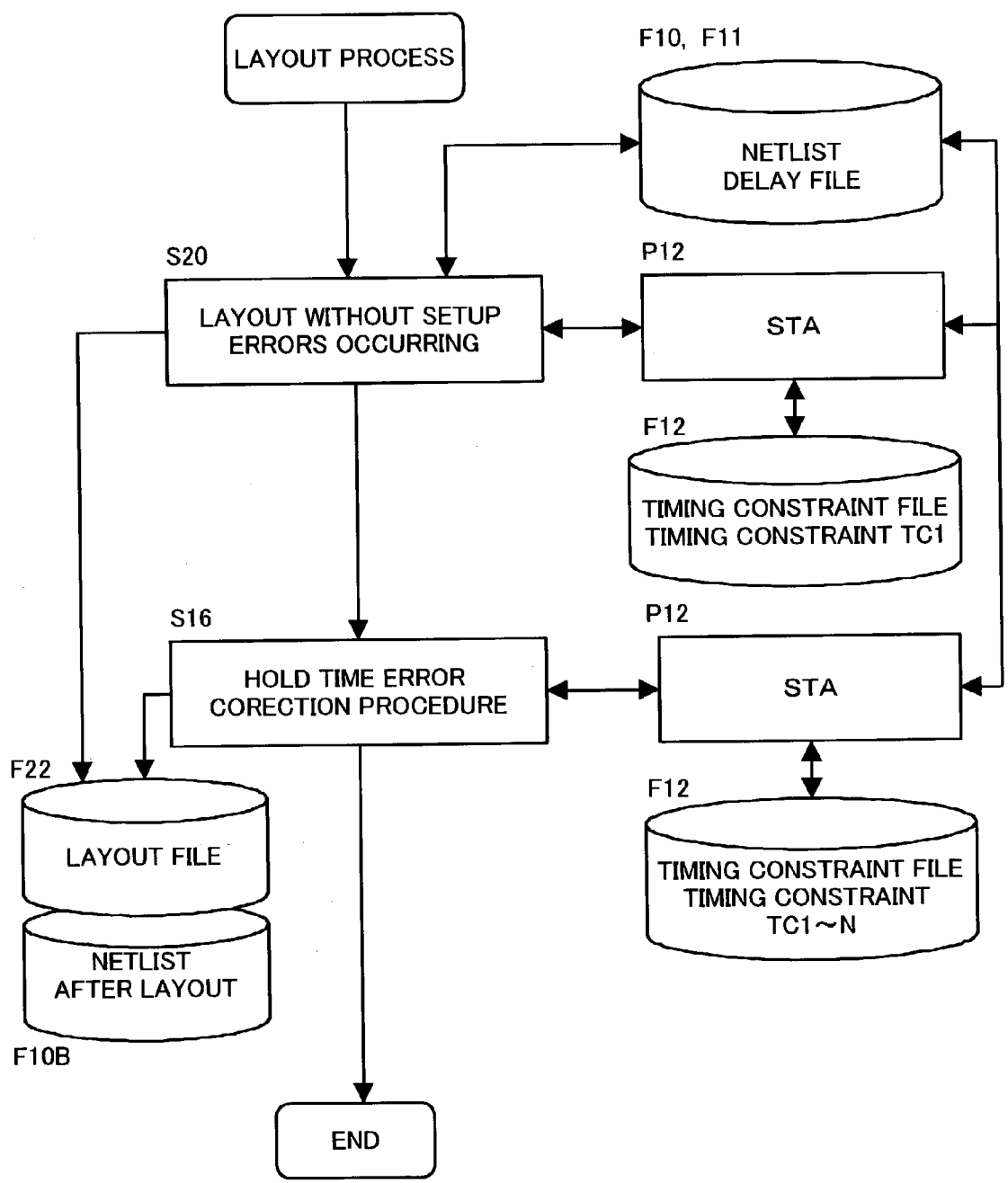
FIG. 5 is a flowchart of the second layout process in the embodiment.

FIG. 5 is a flowchart of the second layout process of the embodiment. In the second layout process, as opposed to the first layout process, hold errors are corrected for a plurality of timing constraints within the layout procedure (S20), and the absence of setup errors and hold errors is confirmed using delay characteristics after layout.

In the second layout process, first the cells and wiring in the netlist F10 are arranged on the chip so as not to cause setup errors, using the layout tool P10 with the STA tool P12 operating in the background. This setup error check is, as in the first layout process, performed by determining whether errors occur under the strictest timing constraint TC1 among a plurality of timing constraints. Hence, setup errors do not occur under the timing constraint TC1 in an integrated circuit for which layout is completed.

Next, the procedure S16 is executed to correct hold errors for a plurality of timing constraints TC1 to TCN. This hold time error correction procedure S16 is the same as the first layout process. However, in this procedure the delay characteristics for the state in which delay buffers are inserted in order to correct hold errors are used so that hold errors are corrected within the range in which setup errors do not occur. Hence when this procedure ends, the layout process is completed.

Summary of Hold Error Correction Processing

Figure 6:
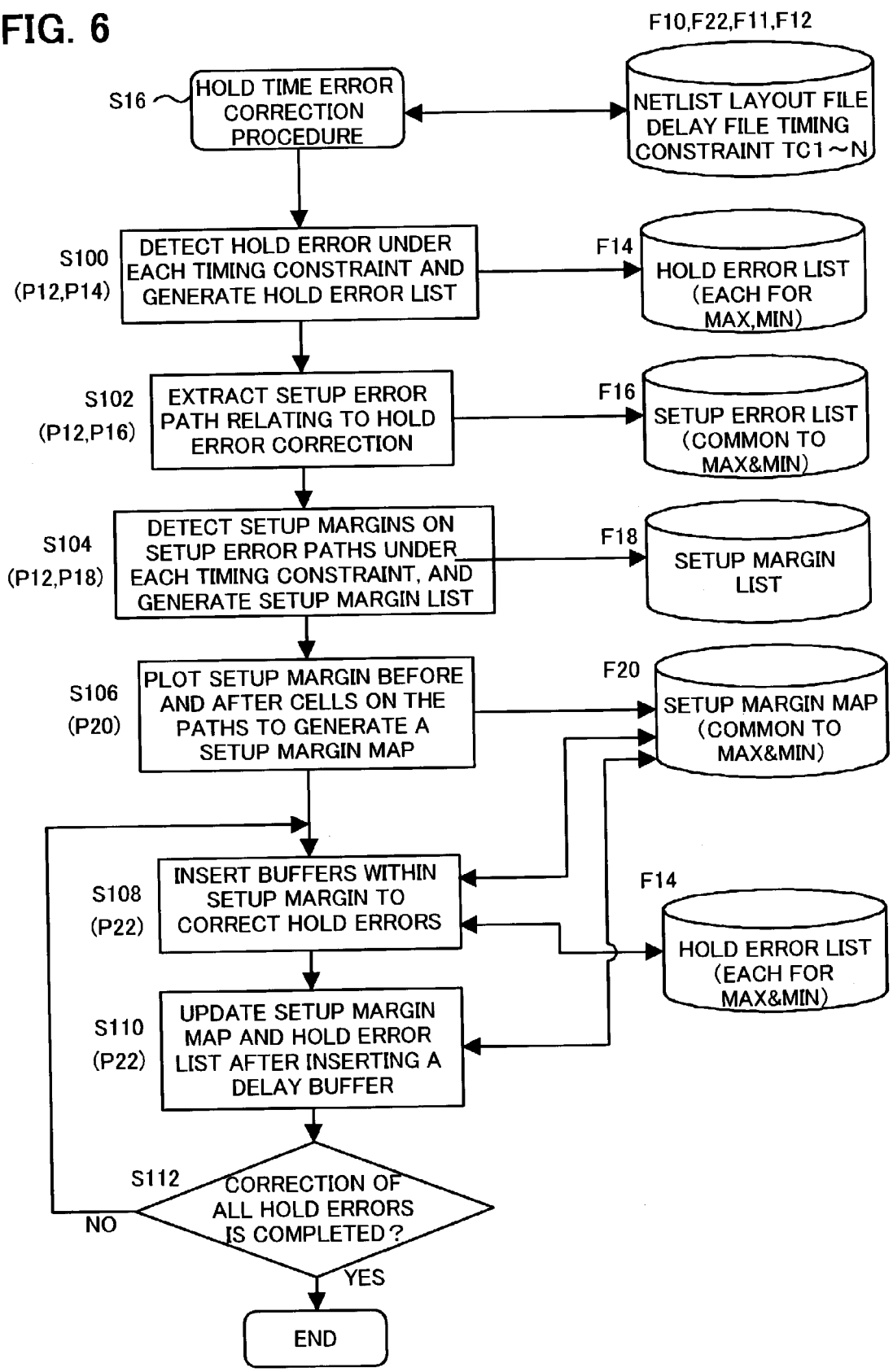
FIG. 6 is a flowchart of the hold error correction method in the embodiment.

Next, a summary explanation of the hold error correction procedure is given. FIG. 6 is a flowchart of the hold error correction method in this embodiment. As shown in FIGS. 4 and 5, at the stage of the hold error correction procedure, the netlist F10, layout file F22, delay file F11, and timing constraint file F12 are provided. The timing constraint file F12 includes a script file describing the plurality of timing constraints TC1 to TCN corresponding to the plurality of operating modes of the integrated circuit.

First, hold errors are detected under a plurality of timing constraints for an integrated circuit for which layout has been performed, and a hold error list F14 is generated (S100), having hold error paths in which hold errors occur, and hold error values satisfying a plurality of timing constraints which are hold error values (time values indicating the extent to which hold times are insufficient) for each hold error path. To generate this hold error list, the programs for the STA tool P12 and the hold error list creation tool P14 are executed. As explained above, it is desirable that hold error lists be created separately for the MAX side (low-speed operation) and the MIN side (high-speed operation) delay characteristics. A specific example is described in detail later.

By executing the STA tool for each timing constraint, hold error paths and their hold error values are detected. Of the hold error values for the plurality of timing constraints existing on the same path, the largest error value is selected and combined. This hold error list F14 is a list of entities for hold error correction, and provides basic data determining the delay values and insertion positions of delay buffers to be inserted later in order to correct hold errors. If the largest hold error value for one path is eliminated, the hold error value for all timing constraints is eliminated for the one path; hence the largest error value is selected among the error values for the plurality of timing constraints.

Next, paths on which there is the possibility of occurrence of setup errors when delay buffers are inserted to correct hold errors, are extracted as setup error paths (S102). In this extraction method, paths are extracted which for example have at least one portion in common with hold error paths. Or, all paths having only setup margins shorter than delay values for delay buffer under the MAX delay characteristics, which is generated upon insertion of the delay buffer to correct the largest hold error value among the hold error values, are extracted.

In the former method, paths are extracted whose the setup time may be affected when a delay buffer is inserted into a hold error path. In the latter method when a delay buffer having the delay amount of the error value is inserted in order to eliminate a hold error, a new setup error may be generated in paths on which have only a setup margin smaller than the delay amount. One of these methods is selected according to the extraction processing, or according to the amount of data of the extraction results. Setup error paths are generated in common for MAX and for MIN delay characteristics.

Setup margins on setup error paths are detected by the STA tool P12 for a plurality of timing constraints, setup margins are selected which can satisfy this plurality of timing constraints, and a setup margin list F18 is created (S104). In order to satisfy a plurality of timing constraints, among the margins detected for each timing constraint, the smallest margin is selected and taken to be the margin for each setup error path. That is, if a delay buffer is inserted within this range of setup margins, no new setup errors occur.

The margin values of the setup margin list F18 are then differentiated by path and allocated before and after cells on hold error paths to generate the setup margin map F20 (S106). This setup margin map F20 is used to verify that no new setup errors occur when delay buffers are inserted for hold error correction. In other words, this map is referenced in order to ensure that the delay amount of a delay buffer inserted at a given position does not exceed the setup margin on the map at the position of insertion. If it is within the margin range, no new setup errors occur.

Finally, in order to eliminate error values in the hold error list, hold error corrections are performed in which delay buffers having delay amounts corresponding to error values are inserted in hold error paths (S108). At this time, the setup margin map F20 is referenced, and delay buffers are inserted within a range of delay amounts and at positions so as not to exceed the setup margins.

When it is necessary to insert a plurality of delay buffers, after inserting one delay buffer the setup margin map F20 and the hold error list F14 are updated (S110), then the delay amount and position of the next delay buffer are selected, and insertion is again performed (S108). This processing S108, S110 is repeated until correction of all hold errors is completed, that is, until all the error values of the hold error list are eliminated (S112).

Specific Example

Figure 7:
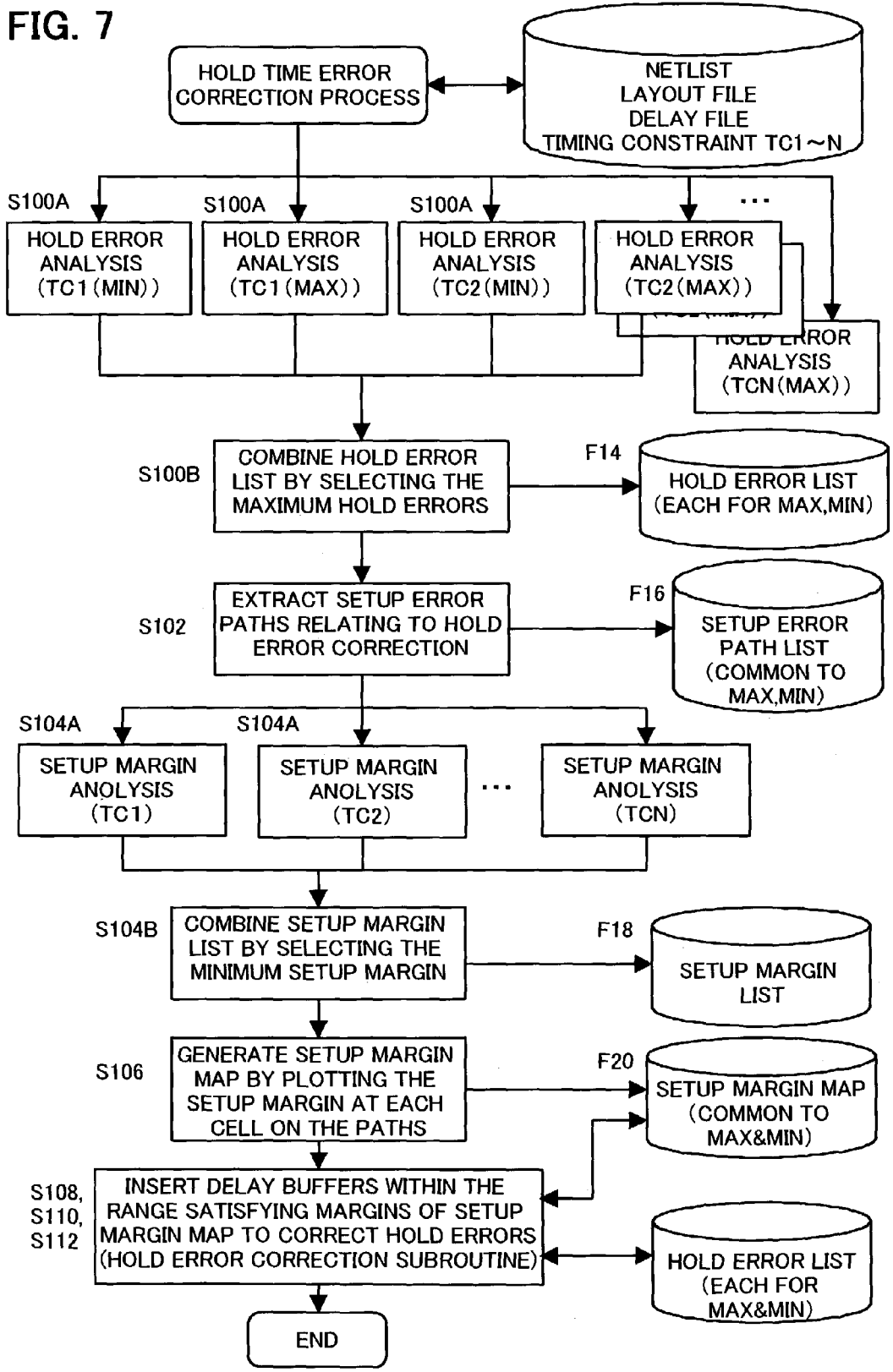
FIG. 7 is a detailed flowchart of the hold time error correction process in the embodiment.
Figure 8:
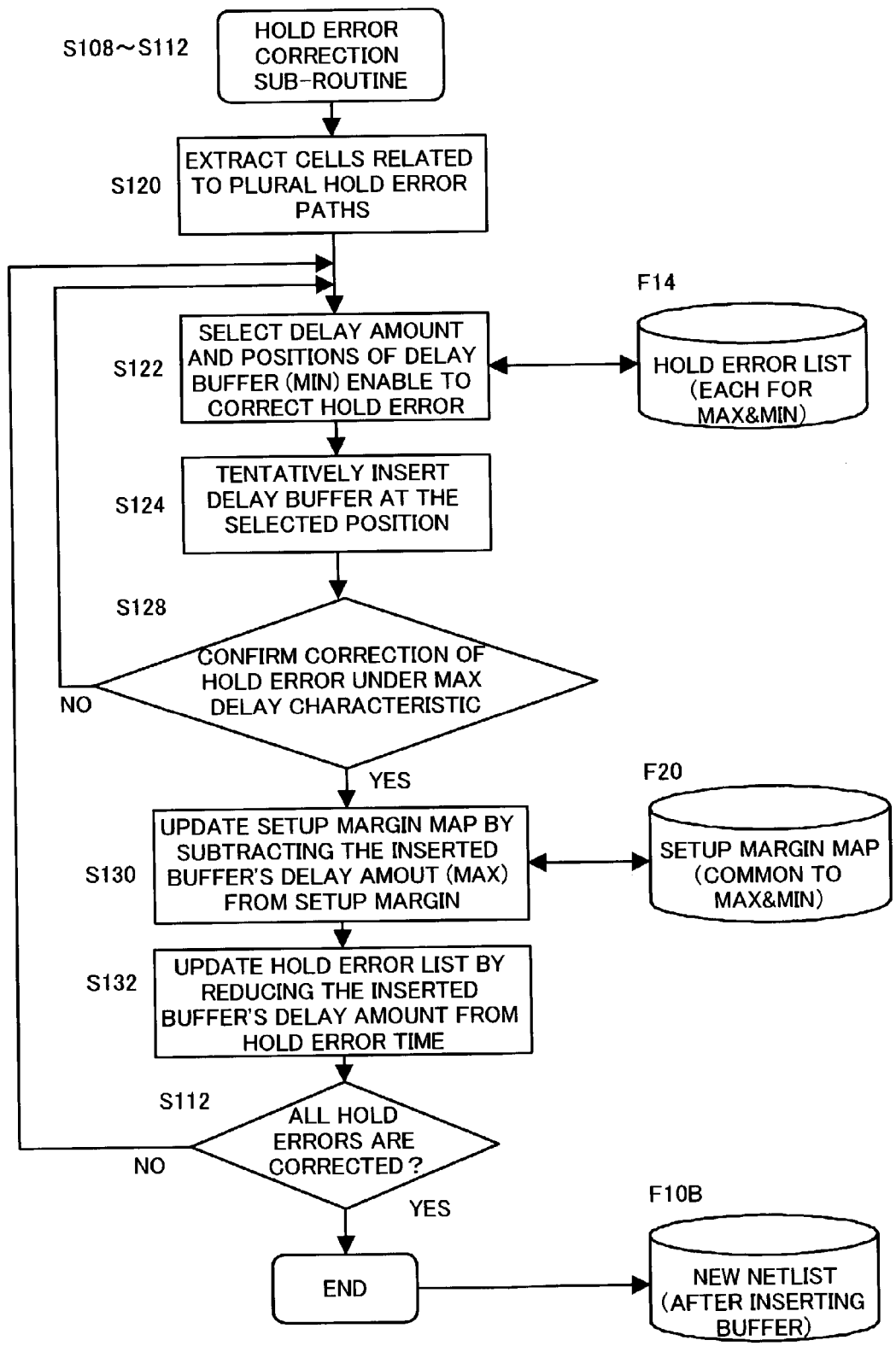
FIG. 8 is a detailed flowchart of the hold time error correction process in the embodiment.
Figure 9:
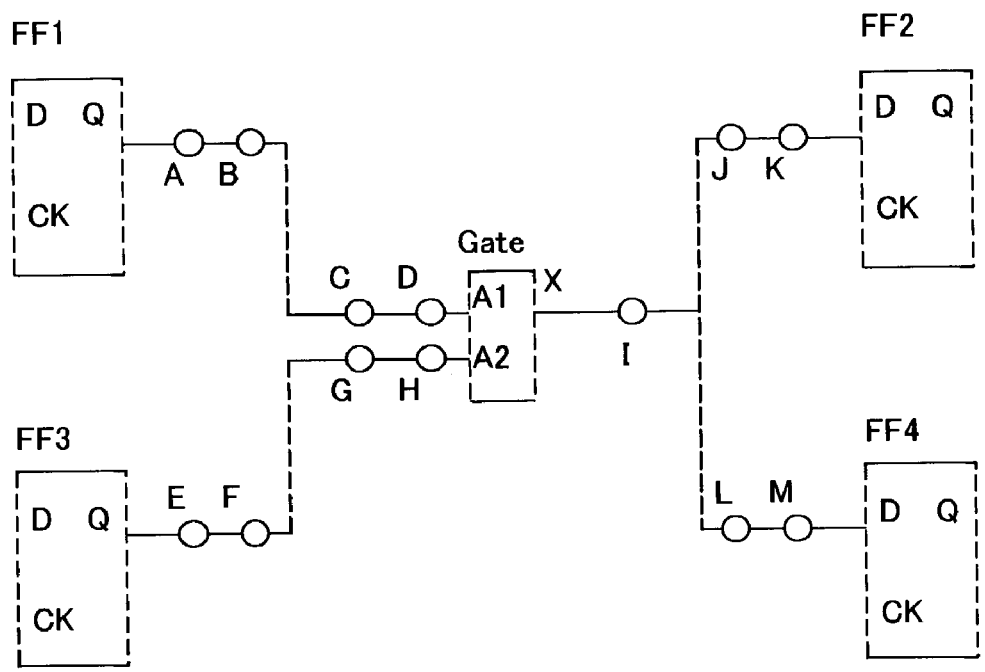
FIG. 9 is a figure showing a specific example of a circuit to be subjected to the correction process.

Next, a specific circuit example is presented, and the above hold time error correction process is explained. FIG. 7 and FIG. 8 are detailed flowcharts of the hold time error correction process in this aspect. The same symbols are assigned to the same procedures and processing as those in FIG. 6. FIG. 9 is a figure showing a specific example of a circuit to be subjected to the correction process. As with the circuit example shown in FIG. 2, this example circuit has four flip-flops FF1 to FF4 and a gate GATE; the output data Q from the flip-flop FF1 is inputted to the gate input A1, and the output X is branched below cell I and supplied to the inputs D of the flip-flops FF2 and FF4. The output data Q from the flip-flop FF3 is inputted to the gate input A2. Hence the circuit of FIG. 9 has two signal paths from flip-flop FF1 to flip-flops FF2 and FF4, and two signal paths from flip-flop FF3 to flip-flops FF2 and FF4. In the circuit example of FIG. 9, a plurality of cells A through M are positioned on the signal paths.

Hold Error List Creation

Hold time error correction is performed in a state in which the netlist and layout file have been generated for this circuit. First the hold error list F14 is generated. FIG. 10 is a figure showing the hold error list for the circuit example of FIG. 9.

As shown in the detailed flowchart of FIG. 7, the procedure to create the hold error list F14 comprises hold error analysis S100A, and a hold error list combining procedure S100B. Hold error analysis and extraction of error values is performed by the STA tool P12, referring to the netlist F10, layout file F22, delay file F11, and timing constraint file F12. Hold error detection is performed for all timing constraints, using the MIN side (high-speed operation) delay characteristics and the MAX side (low-speed operation) delay characteristics. Hence in the flowchart of FIG. 7, the hold error analysis is performed in parallel for each of the timing constraints using both the MIN delay characteristics and the MAX delay characteristics.

Figure 2A:
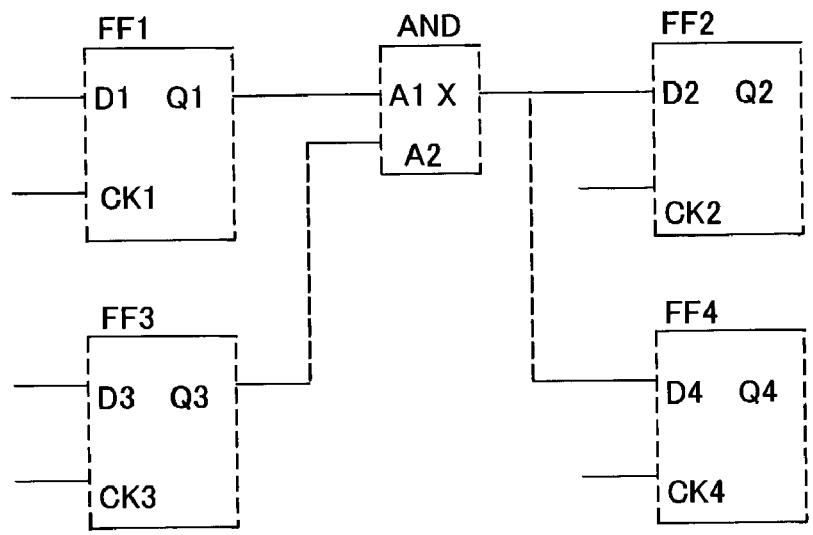
FIG. 2 is a figure which explains the problems to be solved by this invention.
Figure 2B:
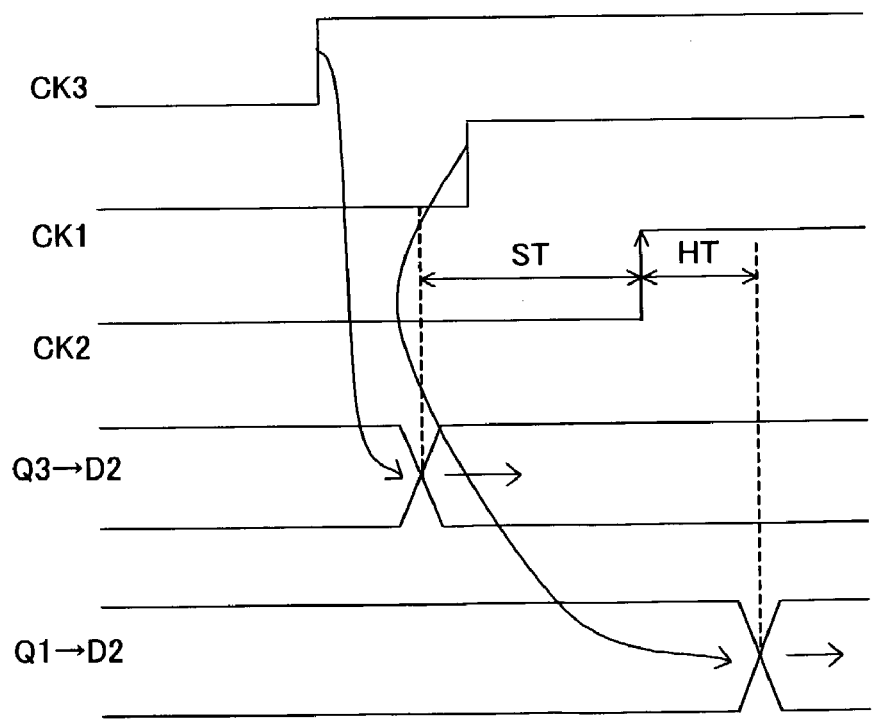

In the example of FIG. 10, lists (A) and (B) are shown for the MIN delay characteristics (high-speed operation) for two timing constraints, TC1, TC2. In FIG. 10, the list (A) is the hold error list for timing constraint TC1; a −25 ps hold error and a −100 ps hold error are detected for a hold error path between flip-flops FF1 and FF2, and for a hold error path between flip-flops FF1 and FF4, respectively. Here, the path between the flip-flops FF1 and FF2 is a path in which the input D is accepted in response to the clock CK for FF1, and the output Q therefore is supplied to the input D of FF2 via the gate GATE. As shown in FIG. 2, the value indicating the extent to which the hold time, which is the time from the rising edge of the clock CK of the flip-flop FF2 until there is a change in the input D, is shorter than the hold time required by the specification for FF2, is the hold error value. Hence if a delay buffer having a delay value equal to or greater than this hold error value is inserted in the path, the hold error is corrected. Here, a plurality of delay buffers may be used.

Similarly, the list (B) in FIG. 10 is a hold error list for the timing constraint TC2; a hold error of −10 ps and a hold error of −100 ps are detected for a hold error path between the flip-flops FF1 and FF2 and for a hold error path between the flip-flops FF3 and FF4, respectively.

Next, hold error lists determined for each of the timing constraints are combined by selecting hold error values which can satisfy a plurality of timing constraints for each hold error path (S100B). As explained for the examples of the list (A) and (B) in FIG. 10, the hold error paths FF1–FF2 overlap for the two timing constraints TC1, TC2. Error values of −25 ps and −10 ps are detected for the timing constraints TC1 and TC2, respectively. In order to correct the hold errors for both constraints, the larger hold error value of the two should be selected. This is because if a delay buffer is inserted so as to correct the largest hold error value, hold errors will not occur for any timing constraint.

In this way, error values for a plurality of timing constraints are summarized by path, and the largest error values are selected for combining. After the combination, the entire hold error list is as shown in the list (C) in FIG. 10. This list F14 has three hold error paths and their hold error values. Delay buffers are inserted into each of the paths so as to eliminate the hold error values in the hold error list F14.

In the specific example, only the hold error list for the MIN delay characteristics is shown. If the list for the MAX delay characteristics is determined, the conditions with respect to hold times are relaxed, so that the frequency of occurrence of hold errors is reduced, and in some cases, the errors may be contained in the hold errors for the MIN delay characteristics. However, as an exception to this, hold errors for MAX delay characteristic may occur on paths other than those with hold errors for MIN delay characteristic, so that an error value greater than the hold error for the MIN delay characteristic may occur. Hence in the interest of reliability, it is desirable that both types of hold error list be created.

Creation of Setup Margin List and Map

Next, paths (setup error paths) which may possibly cause setup errors when a delay buffer is inserted for hold error correction are extracted (S102). The hold error list of (C) in FIG. 10 contains only three hold error paths, and does not include the path FF3–FF2. However, as shown in FIG. 9, the path FF3–FF2 has in common with FF1–FF2 the partial path in which the cell I is provided. Also, the path FF3–FF2 has in common with the path FF3–FF4 the partial path in which the cells E, F, G, H are provided. Hence if a delay buffer is inserted somewhere in the hold error paths FF1–FF2 and FF3–FF4, the setup time of the path FF3–FF2, which has a partial path in common with these, is changed, and there is the possibility that a new setup error may occur.

Therefore in setup error path extraction processing S102, related paths which have even a partial path in common with hold error paths are extracted as setup error paths. By this means, the size of the setup margin map which will later be referenced during delay buffer insertion can be reduced.

Next, the STA tool is executed, and the magnitude of the setup margin for each setup error path is detected for each of the timing constraints TC1, TC2. The setup error margin is the time difference between the setup time required by specifications and the actual setup time; if a delay amount is within this margin value, no setup error occurs even when a delay buffer is inserted. Setup margins. are determined using the MAX delay characteristics, which are more strict with respect to setup errors.

In the flowchart of FIG. 7, the setup margin list procedure S104 is divided into a margin detection procedure S104A for each timing constraint, and a procedure S104B to combine the margin lists. The setup margin detection procedure S104A can be executed in parallel for each of the timing constraints.

In FIG. 11, the list (B) is a setup margin list for the timing constraint TC1. This includes the margins for each of the extracted related paths shown in the list (A) in the figure. Also in FIG. 11, the list (C) is a setup margin list for the timing constraint TC2. On comparing the two lists, the margin for the path FF1–FF2 is 500 ps under the timing constraint TC1, but 600 ps under the timing constraint TC2; on the other hand, for the path FF3–FF2 the margins differ for the timing constraints TC1 and TC2, at 700 ps and 400 ps respectively.

In the following processing S104B to combine the setup margin lists, a final setup margin list F18 is generated which takes the smallest setup margins for a given path as the setup margin for that path. The list (D) in FIG. 11 is such combined setup margin list. The smallest setup margin means the value for which there is the greatest possibility of occurrence of a setup error; the strictest margins are allocated to each path in the setup margin map which is to be referenced during the subsequent delay buffer insertion. The list (E) in FIG. 11 is the same setup margin list F18 as in the list (D).

Next, a setup margin map is created (S106). In this processing, setup margins are allocated, classified by path, to each of the cells existing on each of the paths of the setup margin list F18 shown in FIG. 11.

Figure 12:
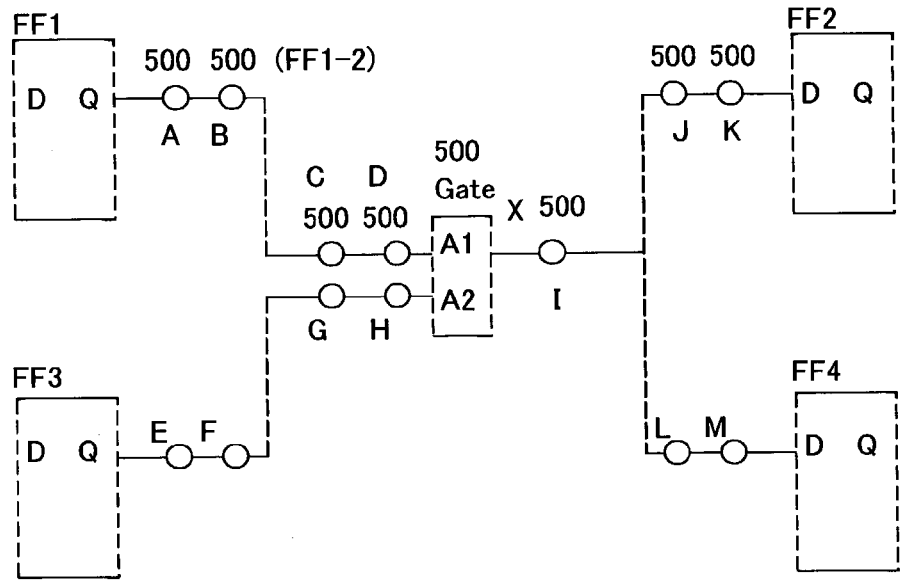
FIG. 12 is a figure showing the setup margin map when a setup margin is allocated to the path FF1–FF2.

FIG. 12 is a figure showing the setup margin map when a setup margin is allocated to the path FF1–FF2. The margin of 500 ps from the setup margin list F18 is allocated to each of the cells and gates on the path FF1–FF2. This allocated margin can be discriminated as the margin for the path FF1–FF2.

Figure 13:
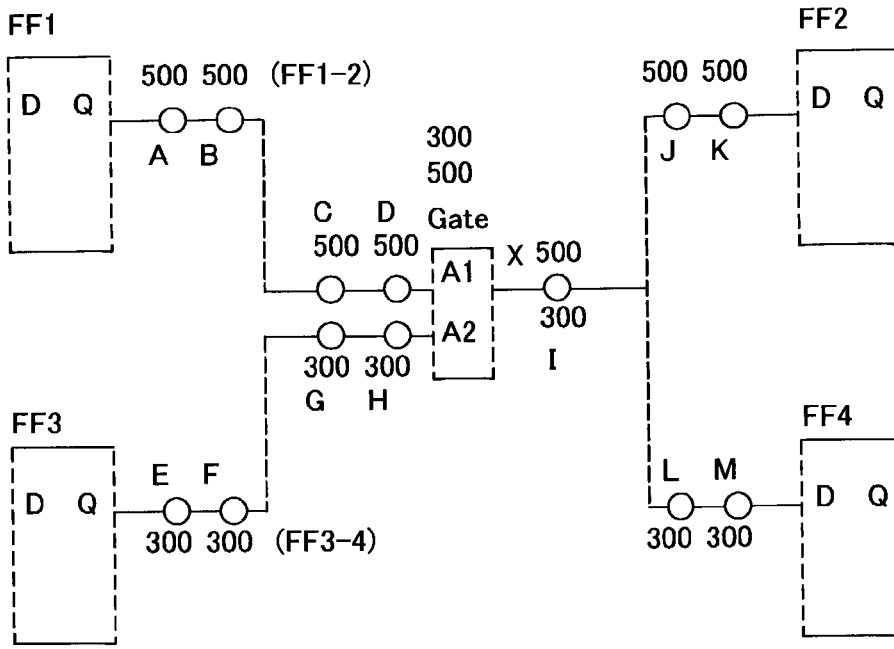
FIG. 13 is a figure showing the setup margin map when a setup margin is allocated to the path FF3–FF4.

FIG. 13 is a figure showing the setup margin map when a setup margin is allocated to the path FF3–FF4. The margin of 300 ps from the setup margin list F18 is allocated to each of the cells and gates on the path FF3–FF4.

Figure 14:
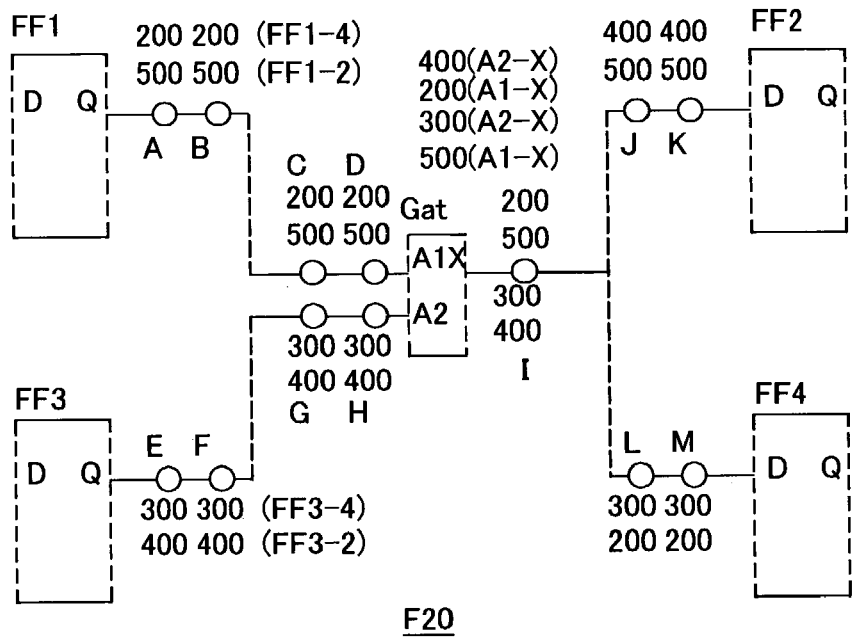
FIG. 14 is a figure showing the setup margin map when setup margins are allocated to the paths FF1–FF4 and FF3–FF2.

FIG. 14 is a figure showing the setup margin map when setup margins are allocated to the paths FF1–FF4 and FF3–FF2. The margins 200 ps and 400 ps are respectively allocated to each of the cells and gates on the path FF1–FF4 and on the path FF3–FF2. The margins of all the paths on the setup margin list F18 have been allocated, so that FIG. 14 shows the final setup margin map F20.

In this setup margin map, the smallest margin among the margins allocated to each cell indicates the delay value that can be inserted before or after the cell without creating a new setup error. Hence if the delay amount and insertion position of a delay buffer inserted in order to eliminate a hold error are determined referring to this map, the occurrence of new setup errors can be avoided. That is, if the delay amount is within the range of the smallest margin at the position of insertion, then insertion of a delay buffer will not cause a setup error.

However, it should be noted that the margins of this setup margin map were determined under the MAX delay characteristics, and it is therefore necessary to confirm that the delay amount of the MAX delay characteristic of the inserted delay buffer is smaller than the smallest margin on the map. Conversely, it is necessary to confirm, for the error values of the hold error list, that error values are eliminated by the delay amount for the corresponding delay, characteristic.

Correction of Hold Errors by Insertion of Delay Buffers

Next, delay buffers are inserted within the range satisfying the margins of the setup margin map to correct hold errors on the hold error list (S108, S110, S112). This processing is indicated in detail in the flowchart of FIG. 8 as the hold error correction subroutine.

As shown in FIG. 8, first, cells related to a plurality of hold error paths are extracted (S120) in order to detect a position suitable for insertion of a delay buffer. By inserting a delay buffer before or after a cell traversed by as many hold error paths as possible, the hold errors of a large number of hold error paths can be corrected by inserting a small number of delay buffers. In this circuit example, four hold error paths simultaneously traverse the gate output X and cell I positions, and two hold error paths traverse each of the other cells. That is, all cells are extracted by the extraction procedure S120. The positions before and after the extracted cells are selected with priority as positions for delay buffer insertion.

Next, candidate delay amounts and insertion positions for delay buffers able to correct hold errors are selected (S122). Specifically, a delay buffer having a delay amount (MIN delay characteristics (high-speed operation)) capable of eliminating insofar as possible the error values of the hold error list for the MIN delay characteristics (high-speed operation) is selected, within the range permitted by the setup margin map (however, using MAX delay characteristics). The delay buffer is then tentatively inserted (S124).

Figure 15:
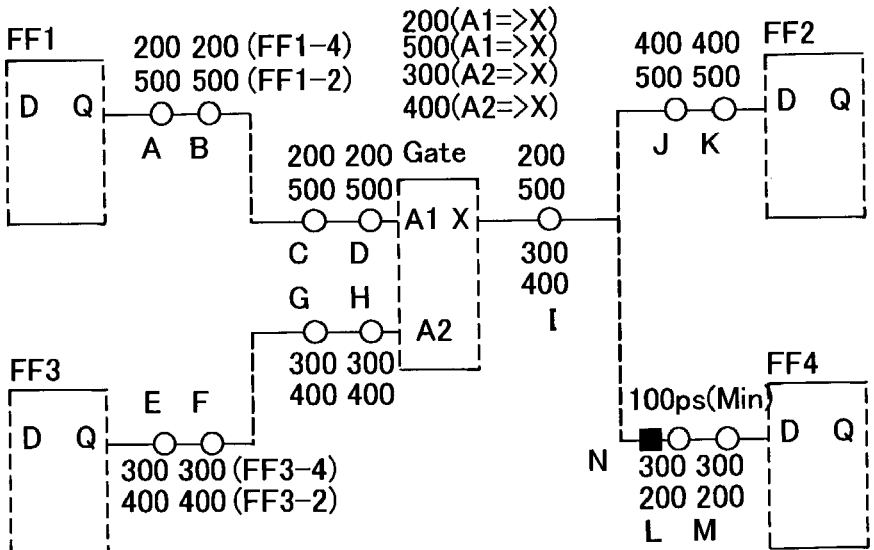
FIG. 15 is a figure showing the setup margin map when a cell is inserted in order to correct a −100 ps hold error of the path FF1–FF4.

FIG. 15 is a figure showing the setup margin map when a cell is inserted in order to correct the −100 ps hold error of the path FF1–FF4. In this example, cell N is inserted between cell I and cell L. The margin values of all paths relevant to this position appear on the margin map. According to the margin map, the minimum setup margin for cell L is 200 ps. Hence it can be judged that if the delay buffer has a MAX delay characteristic (low-speed operation) of less than 200 ps, insertion is possible. By inserting a delay buffer N with a MIN delay characteristic (high-speed operation) exceeding 100 ps (hold error value), and a MAX delay characteristic (low-speed operation) of less than 200 ps (setup margin), the hold error of path FF1–FF4 can be corrected without the occurrence of new setup errors.

According to the detailed flowchart of FIG. 8, after tentatively inserting a delay buffer, the MAX delay characteristic (low-speed operation) hold error list is checked, and a check is performed to determine whether the hold error at the MAX delay characteristic for the path FF1–FF4 has also been corrected (S128). This check is performed by judging that, if the delay amount for the MAX delay characteristic of the inserted buffer exceeds the hold error value for the MAX delay characteristic, then error correction has been performed. By performing this check, both the MAX and MIN hold errors for the path FF1 to FF4 can be corrected simultaneously. If correction of the MAX delay characteristic hold error is omitted, then the procedures S128 can be omitted.

Figures 16, 17:
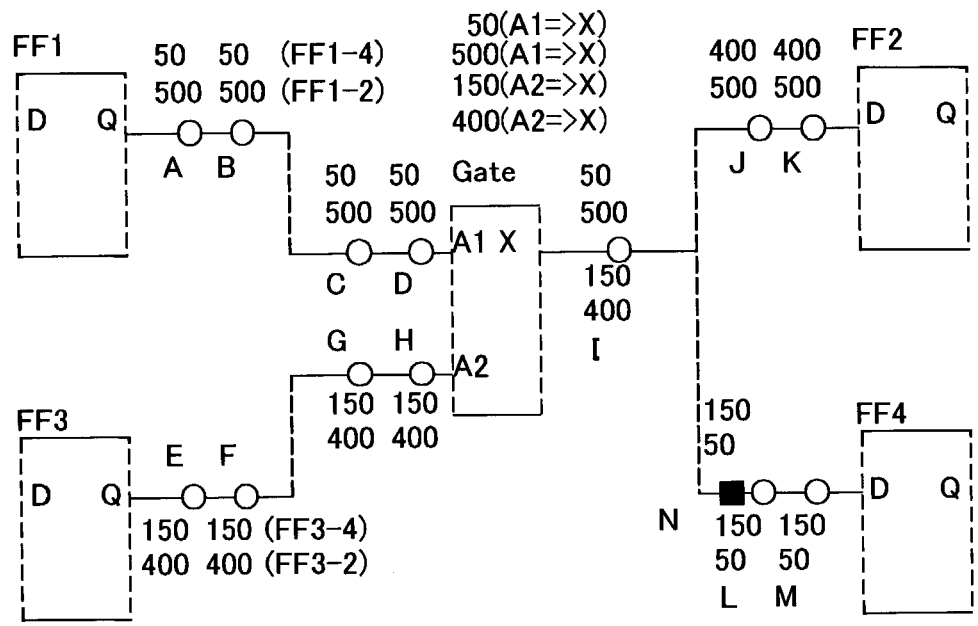
FIG. 16 is a figure showing the setup margin map after updating.
FIG. 17 is a figure showing the setup margin list F18 and hold error list F14 after updating accompanying insertion of a delay cell N.

As a result of insertion of the delay buffer N, the setup margin map is updated (S130). This is because insertion of the delay buffer N is accompanied by a partial reduction of margins within the margin map (resulting in stricter conditions). FIG. 16 is a figure showing the setup margin map after this updating. Further, the hold error list F14 is also updated (S132).

The paths affected by an inserted delay cell N are extracted from the margin map based on the position of the inserted cell. In the margin map, the margins of the paths FF1–FF4 and FF3–FF4 are allocated to the position of the cell L, and it is determined that these paths are affected. Hence as described above, the delay value of the inserted delay cell N, for the MAX delay characteristic (low-speed operation), affecting the setup margin is calculated. In this calculation, for example, the delay coefficient of the inserted delay cell N is multiplied by the reference delay amount (multiplication) to obtain the delay value for the MAX delay characteristic. Here the delay value for the MIN delay characteristic (low-speed operation) of the inserted delay cell N is 100 ps, therefore multiplying this by the delay coefficient of 1.5, the MAX delay characteristic (high-speed operation) delay value of 150 ps is obtained.

On subtracting the delay value of 150 ps of the inserted cell N from the margins for paths FF1–FF4 and FF3–FF4 in the margin map, the updated margin map F20 of FIG. 16 is obtained. There are no negative margins in this margin map, and so it can be confirmed that no new setup errors will occur. A margin is also allocated to the inserted delay cell N in the updated margin map F20.

FIG. 17 is a figure showing the (A) setup margin list F18 and (B) hold error list F14 after updating accompanying insertion of a delay cell N. In the setup margin list F18 of (A) in FIG. 17, the margins of the paths FF1–FF4 and FF3–FF4 are reduced by 50 ps and 150 ps respectively. In the hold error list F14 of (B) in FIG. 17, the hold error of the corrected path FF1–FF4 is eliminated.

As described above, the delay value for the MAX delay characteristic (low-speed operation) of an inserted cell which can correct a hold error is computed, the setup margin map is referenced, each cell on the hold error path is scanned, a judgment is made as to whether the computed delay value is within the range of the minimum margin for the insertion position, and if it is within the range, the position is finalized as the insertion position. The setup margin map is then updated using this computed delay value. This processing is repeated until all hold errors have been corrected (S112).

Figure 18:
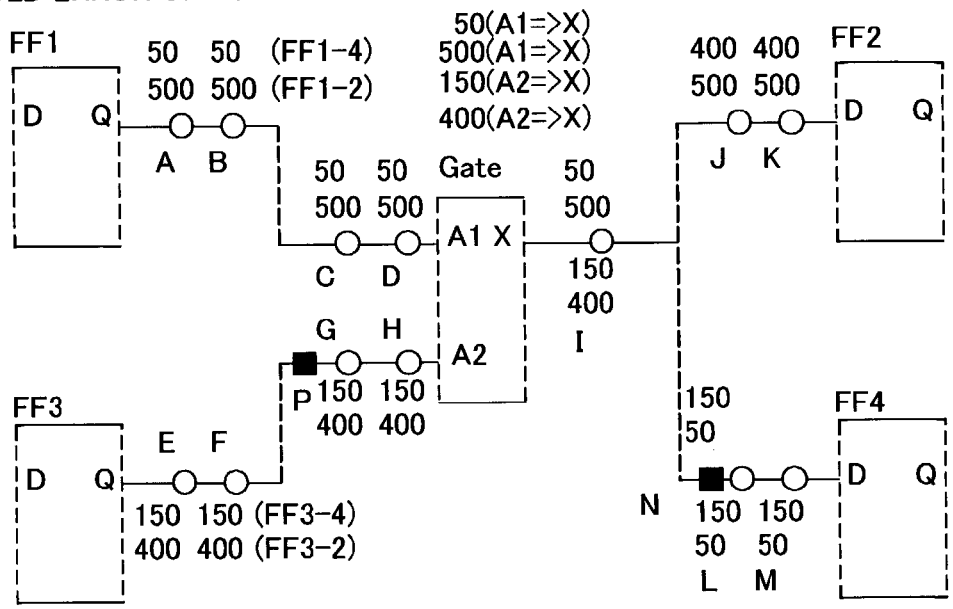
FIG. 18 is a figure showing the setup margin map when a cell is inserted in order to correct a −100 ps hold error of the path FF3–FF4.

Next, the processing to correct the hold error −100 ps of the path FF3–FF4 is explained. FIG. 18 is a figure showing the setup margin map when a cell is inserted in order to correct the −100 ps hold error of the path FF3–FF4. In order to insert a delay cell with a delay amount of 100 ps (MIN delay characteristic) at some position on the path so as to correct the hold error of −100 ps (MIN delay characteristic) of the path FF3–FF4, a position must be selected which has a setup margin equal to or greater than the 150 ps delay amount of the MAX delay characteristic of the delay cell (in the case of a delay coefficient of 1.5).

According to the margin map of FIG. 18, the minimum margin at a position below the gate GATE on the path FF3–FF4 is 50 ps, and insertion is not possible. However, if the position above the gate GATE of the path FF3–FF4 is selected, the minimum margin is 150 ps, and so insertion is possible. Hence as shown in FIG. 18, the insertion position of the inserted cell P is selected between cells F and G.

Figure 19:
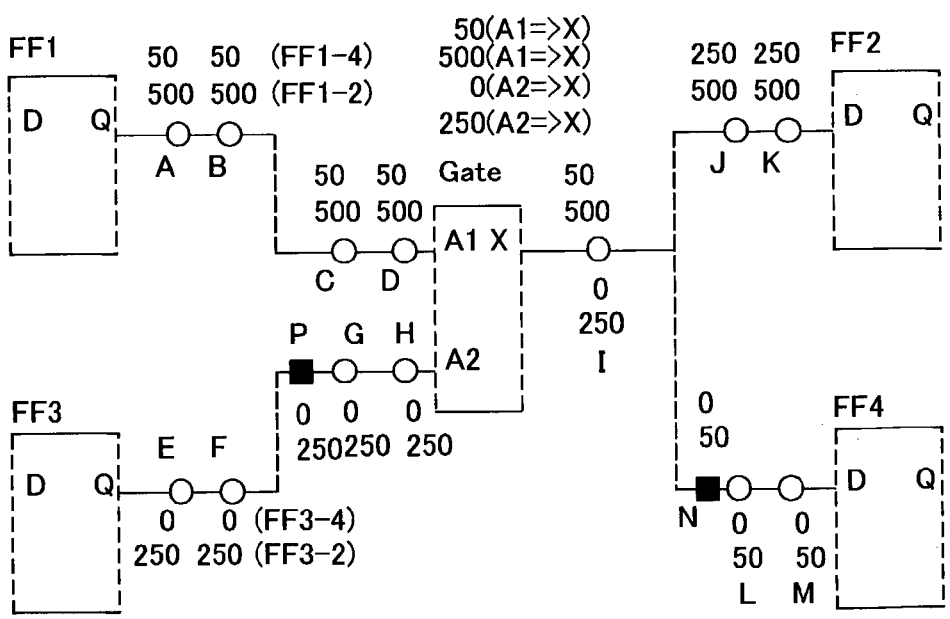
FIG. 19 is a figure showing the setup margin map after updating.

FIG. 19 is a figure showing the setup margin map F20 after updating to accompany insertion of the above inserted cell P. The margins of cells E, F, G, H, Gate(A2–X), I, J, K, L, M correspond to the paths FF3–FF4 and FF3–FF2, and so the delay value of 150 ps of the above MAX delay characteristic is subtracted from these path margins. As a result, the setup margin of the path FF3–FF4 becomes 0 ps, and it is no longer possible to insert further delay cells on this path.

Figures 20, 21:
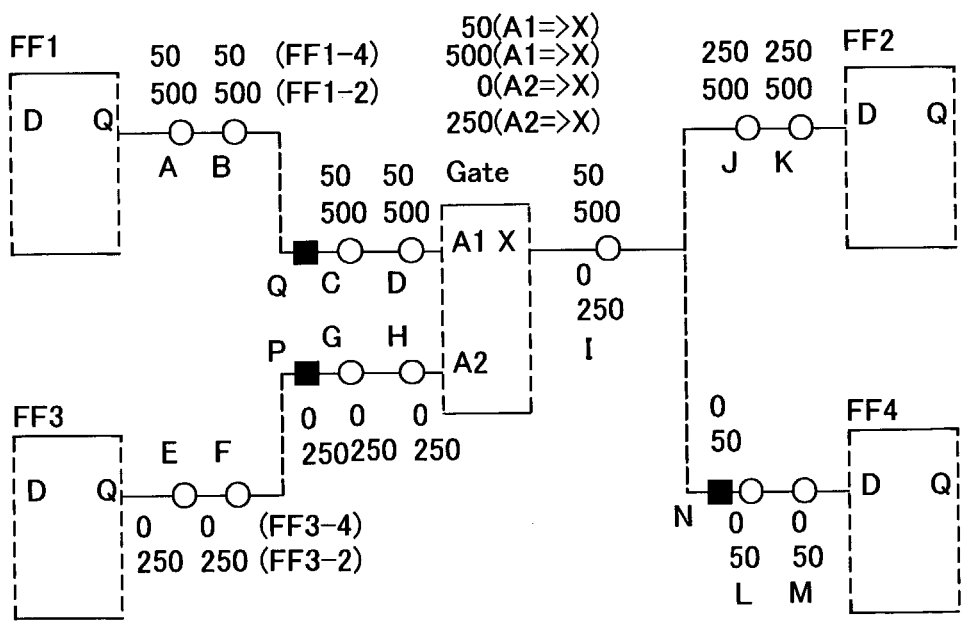
FIG. 20 is a figure showing the setup margin list F18 and hold error list F14 after updating accompanying insertion of a delay cell P.
FIG. 21 is a figure showing the setup margin map when a cell is inserted in order to correct a −20 ps hold error of the path FF1–FF2.

FIG. 20 is a figure showing the (A) setup margin list F18 and (B) hold error list F14 after updating accompanying insertion of a delay cell P. According to the hold error list F14, the only remaining hold error is −25 ps on the path FF1–FF2.

FIG. 21 is a figure showing the setup margin map when a cell is inserted in order to correct the −25 ps hold error of the path FF1–FF2. If the MAX delay characteristic delay value of a delay cell having a MIN delay characteristic delay value of 25 ps is 50 ps, then a position with a minimum margin of 50 ps or greater is detected for each cell on the path FF1–FF2. In the margin map of FIG. 21, no matter what the position on the hold error path FF1–FF2, except for before and after the cell I, the minimum margin is 50 ps or greater, so that insertion is possible anywhere except before or after the cell I. In the example of FIG. 21, a delay cell Q is inserted between cells B and C.

Figures 22, 23:
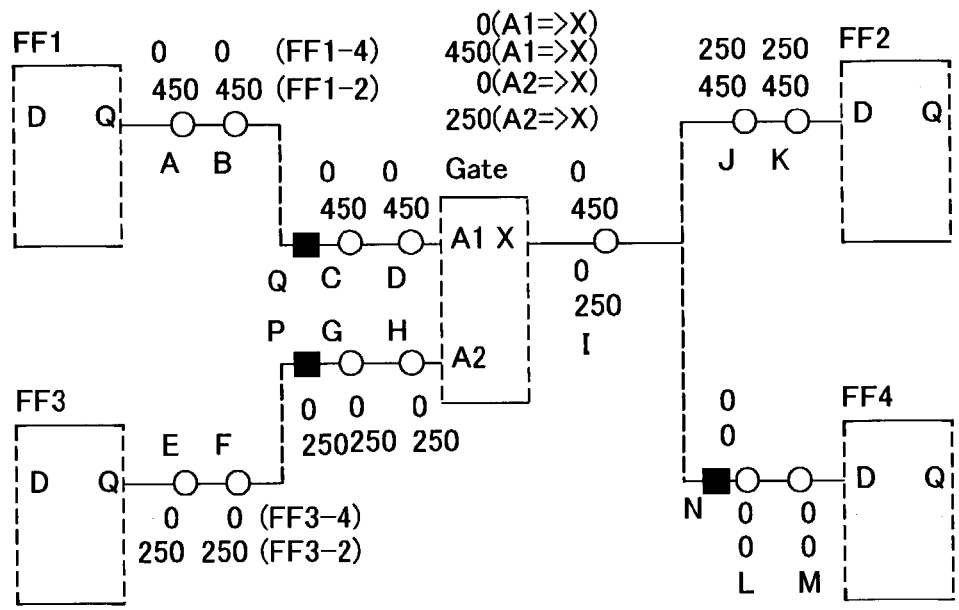
FIG. 22 is a figure showing the setup margin map F20 after updating accompanying insertion of a delay cell Q.
FIG. 23 is an example of a hold error list having hold errors at rising edges and at falling edges.

FIG. 22 is a figure showing the setup margin map F20 after updating accompanying insertion of the delay cell Q. As shown in the figure, the minimum margin is already 0 in part of the path FF1–FF2 and the path FF1–FF4, but it is not negative, and no new setup errors occur.

With this, all hold errors have been corrected. Also, there are no negative setup margins on the setup margin map, and therefore the occurrence of new setup errors has been avoided.

MODIFIED EXAMPLE 1

In the above embodiment, during the procedure S102, paths which have at least a portion in common with hold error paths were extracted as paths which are affected when a delay buffer is inserted to correct a hold error (related setup error paths). By this means, the scale of the setup margin map could be made an appropriate size.

In one modified example, when it is difficult to extract paths having at least a portion in common with the above hold error paths, the following method may be used instead to extract the related setup error paths. The largest hold error value is extracted from the error values of the hold error list, and it is determined, when a delay buffer with this error value is inserted, how much of a delay amount is added using the MAX delay characteristic. Of the setup margins determined using each timing constraint, those paths having setup margins equal to or less than the delay amount for the above MAX condition are then extracted as setup error paths.

Consequently this extraction procedure is performed after the procedure S104B and before the procedure S106 in FIG. 7. All paths and their margins are included in the setup margin list F18, and from these, paths with margins equal to or less than the MAX delay characteristic delay value corresponding to the above largest hold error are extracted. These paths included paths which are in no way related to the hold error path; but at least paths having large margins so that it cannot cause setup errors even if a delay cell (or delay buffer) is inserted in order to correct the largest hold error, are excluded. By this means, the scale of the margin map can be reduced to some extent. However, it is possible that the scale of the margin map to be referenced when inserting delay buffers will become large. The volume of processing should be compared with that entailed by the above-described embodiment, and the appropriate method should be chosen.

MODIFIED EXAMPLE 2

In this modification, a prescribed margin is subtracted from the margin values of the setup margin map. In the above-described embodiment, if the delay value at the MAX delay characteristic of the inserted cell is equal to or less than the minimum setup margin, insertion at that position is permitted. However, in consideration of computation errors of the STA tool, the margin values of the setup margin map are set to, for example, approximately 20% lower. Or, when the delay value at the MAX delay characteristic of the inserted cell is equal to or less than 80% of the minimum setup margin value, insertion at that position may be permitted. By this means, even if there is some degree of error in the setup margin calculations, the occurrence of new setup errors can be reliably avoided.

In particular, in the layout process shown in FIG. 4, there is the possibility that the layout processing of a delay cell inserted in the procedure S16 to insert a delay cell for correction of a hold error is not performed, therefore delay values may be increased later due to the layout. Consequently, layout of delay cells may not be possible. By providing a margin in the above setup margin, such a possibility can be reduced.

MODIFIED EXAMPLE 3

In the specific example of FIG. 9 through FIG. 22, the hold error list is subjected to error correction using the MIN delay characteristic as shown in FIG. 10. Hence only setup error paths related to hold error paths for this MIN delay characteristic are extracted. When the hold error list also includes errors at the MAX delay characteristic, setup error paths related to such MAX-side hold error paths must also be extracted, and the setup margins of these paths added to the setup margin map. Hence even if the MAX delay characteristic hold error list is added, only a single type of setup margin map is sufficient.

Creation of the hold error list is similar for the MAX delay characteristic and the MIN delay characteristic. When selecting candidate delay cells for insertion, the hold errors for the MIN delay characteristic are given priority for correction. Hold errors occurring for the MIN delay characteristic (high-speed operation) are more numerous, so that by giving these priority for correction, the probability of simultaneously correcting MAX delay characteristic hold errors as well is high.

In hold error correction processing, when candidate delay cells to correct a hold error at the MIN delay characteristic are first selected, if there exists a MAX delay characteristic hold error on the same path, a check is performed to determine whether that hold error is also corrected. In this check, the delay value of the delay cell for insertion at the MAX delay characteristic is used. If the delay value of the inserted delay cell is larger than the MAX delay characteristic hold error value, then the MAX delay characteristic hold error is also corrected. If the delay value of the inserted delay cell is smaller, then the delay value of the candidate delay cell for insertion is increased, and evaluation is repeated. After correction of all MIN delay characteristic hold errors, if there remain MAX delay characteristic hold errors, delay cells are inserted in order to correct the remaining hold errors.

MODIFIED EXAMPLE 4

Strictly speaking, hold errors exist separately at data rising edges (UP) and at data falling edges (DOWN). Hence in order to more rigorously perform hold error correction, both UP and DOWN hold error lists must be created, and processing performed to correct each. In this case, the delay amounts of inserted delay cells are processed separately for UP and DOWN errors. Accompanying this, separate UP and DOWN setup margin maps are also generated, and separate margin maps are referenced in the respective processing.

FIG. 23 is an example of a hold error list having hold errors at rising edges and at falling edges. Compared with the hold error list F14 of FIG. 10, the list includes two types of hold errors, UP and DOWN. Depending on the path, only one type of hold error may exist.

After detecting hold errors at data signal rising and falling edges, the larger of the UP error value and the DOWN error value may be employed as representative of the error values of the hold error list. In this case, the setup margin map also uses the smaller of the UP and DOWN margins as the representative value. By this means, processing can be simplified.

MODIFIED EXAMPLE 5

Figure 24:
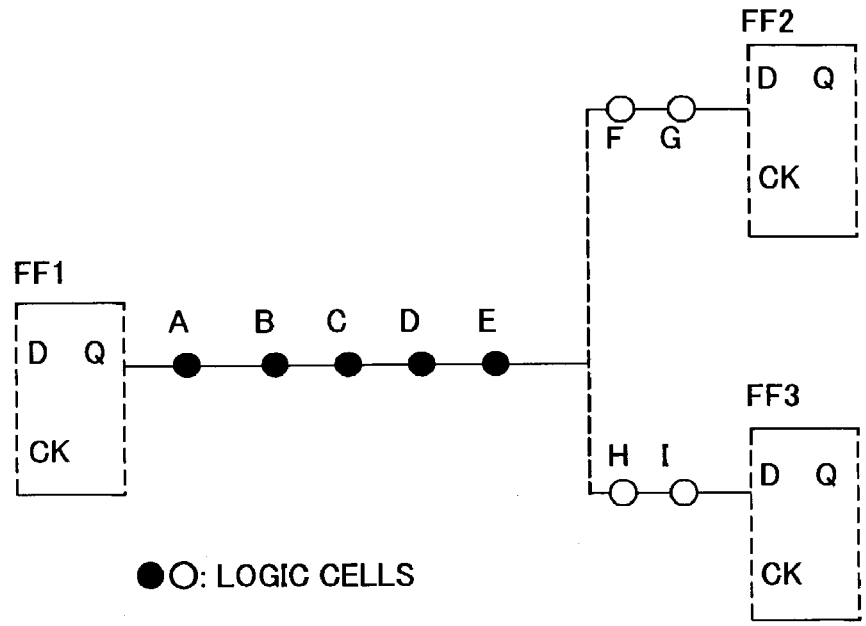
FIG. 24 is a figure showing a method for minimizing the number of delay cells inserted.

As already explained with respect to the procedure S120 for the hold error correction subroutine in FIG. 8, by choosing a position on a path which overlaps with a plurality of hold error paths as the position for insertion of a delay cell for hold error correction, the number of delay cells for insertion can be reduced. FIG. 24 is a figure showing a method for minimizing the number of delay cells inserted. In this circuit example, the paths FF1–FF2 and FF1–FF3 are taken to be hold error generation paths. Here, if a delay cell can be inserted before or after cells A, B, C, D, E, the hold errors for two paths can be simultaneously reduced. Hence by giving priority to cells at such overlapping positions when selecting positions for delay cell insertion, the number of delay cells for insertion can be made as small as possible.

Further, by inserting a delay cell with a delay amount that can be inserted, albeit less than the hold error value, at a position of overlap of a plurality of hold error paths, in some cases the number of inserted delay cells can be similarly reduced.

MODIFIED EXAMPLE 6

In the above embodiment, when creating the setup margin map F20, the setup margins of each of the paths are allocated to cells on the path. However, the present invention is not limited to this; allocation to insertion candidate positions other than cells is also possible. Or, when no cells exist on a path, a virtual setup margin allocation point may be set, and a setup margin is allocated at this point. In this case, the virtual allocation point is added to the insertion candidate positions for the delay cell. In all cases, in order to enable data processing, a virtual cell (or virtual point) is generated, and a setup margin is allocated to the virtual cell.

Figure 25:
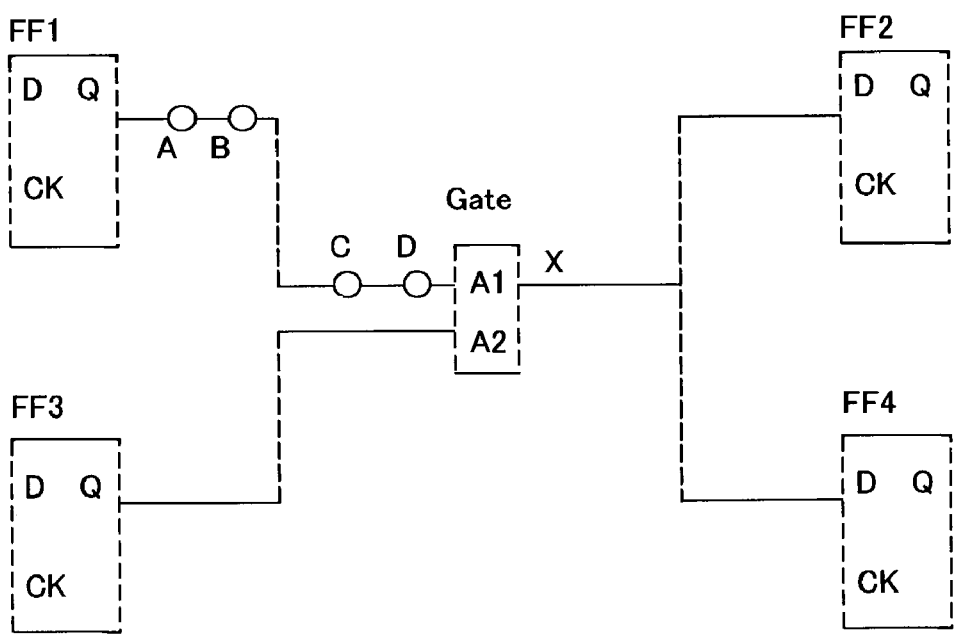
FIG. 25 is a figure showing an example of a circuit in which cells do not exist on a path; and, FIG. 26 is the circuit diagram after setting virtual cells.
Figure 26:
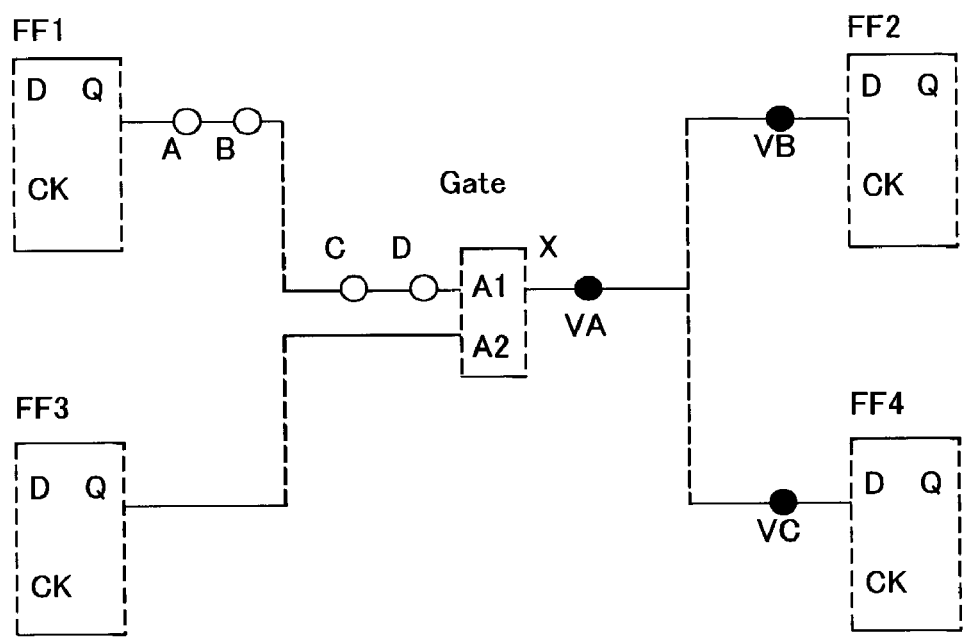

FIG. 25 is a figure showing an example of a circuit in which cells do not exist on a path. In this example, cells do not exist on the paths FF3-A2, X-FF2, or X-FF4. In this case, virtual cells (virtual points) are set to specify setup margins, and setup margins are set at these points. FIG. 26 is the circuit diagram after the setting of virtual cells. In this example, the virtual cells VA, VB, VC are set on the above paths without cells. The virtual cell VA is set ahead of the branch point between the paths X-FF2 and X-FF4.

The rules for setting virtual cells are as follows. (1) If there is not even one cell on an FF—FF path, a virtual cell is inserted. (2) If a signal coming from a route differing from the FF—FF path passes through a logic gate GATE and converges (in FIG. 25, the portion which passes through the gate GATE and converges at the gate output X), if there exist no cells between the converged signal and the latter-stage flip-flop FF, a virtual cell is inserted. This example applies to the virtual cell VA in FIG. 26. (3) If there exist no cells on each of the wiring segments of branches in an FF—FF path, a virtual cell is inserted in each of the wiring segments. This example applies to the virtual cells VA, VB, VC in FIG. 26.

A virtual cell is not inserted in the path FF3-A2; a setup margin can be allocated to the path FF3-A2 at the position of the input A2-output X of the gate GATE, so that insertion of a virtual cell in this path is unnecessary.

In the circuit example of FIG. 9 in the above-described aspect, there exist a plurality of cells A through M; apart from these, virtual points can also be set as candidate positions for insertion of delay cells. In this case, virtual points are set in each of the wiring segments. That is, virtual points are set on each of the paths FF1-A1 and FF3-A2, and in addition virtual points between the output X of the gate GATE and the branch point are set between each of the branch point and FF2, and between the branch point and FF4. Setup margins can be allocated to these virtual points, and a margin map generated.

MODIFIED EXAMPLE 7

In the hold error correction procedure of FIG. 6, whenever the delay buffers are inserted, the hold error list is updated by subtracting the inserted delay time from the hold error value. For example, the hold error list of FIG. 10C is updated into the ones of FIG. 17B and FIG. 20B. In the above mentioned embodiment, the hold error value of only the path through which the delay buffers are inserted is updated.

In this modification, when updating the hold error list, the hold error value of all paths which are effected by the insertion of the delay buffer is updated by subtracting the inserted delay time from each hold error value. For example, in case of inserting the delay cell at the position N in FIG. 15, not only the hold error value of the path FF1–FF4, but also the hold error value of the path FF3–FF4 are updated. According to this update procedure, it is possible to confirm the hold error correction of the other paths which are effected by the insertion of the delay buffer to a certain path.

MODIFIED EXAMPLE8

Figure 27:
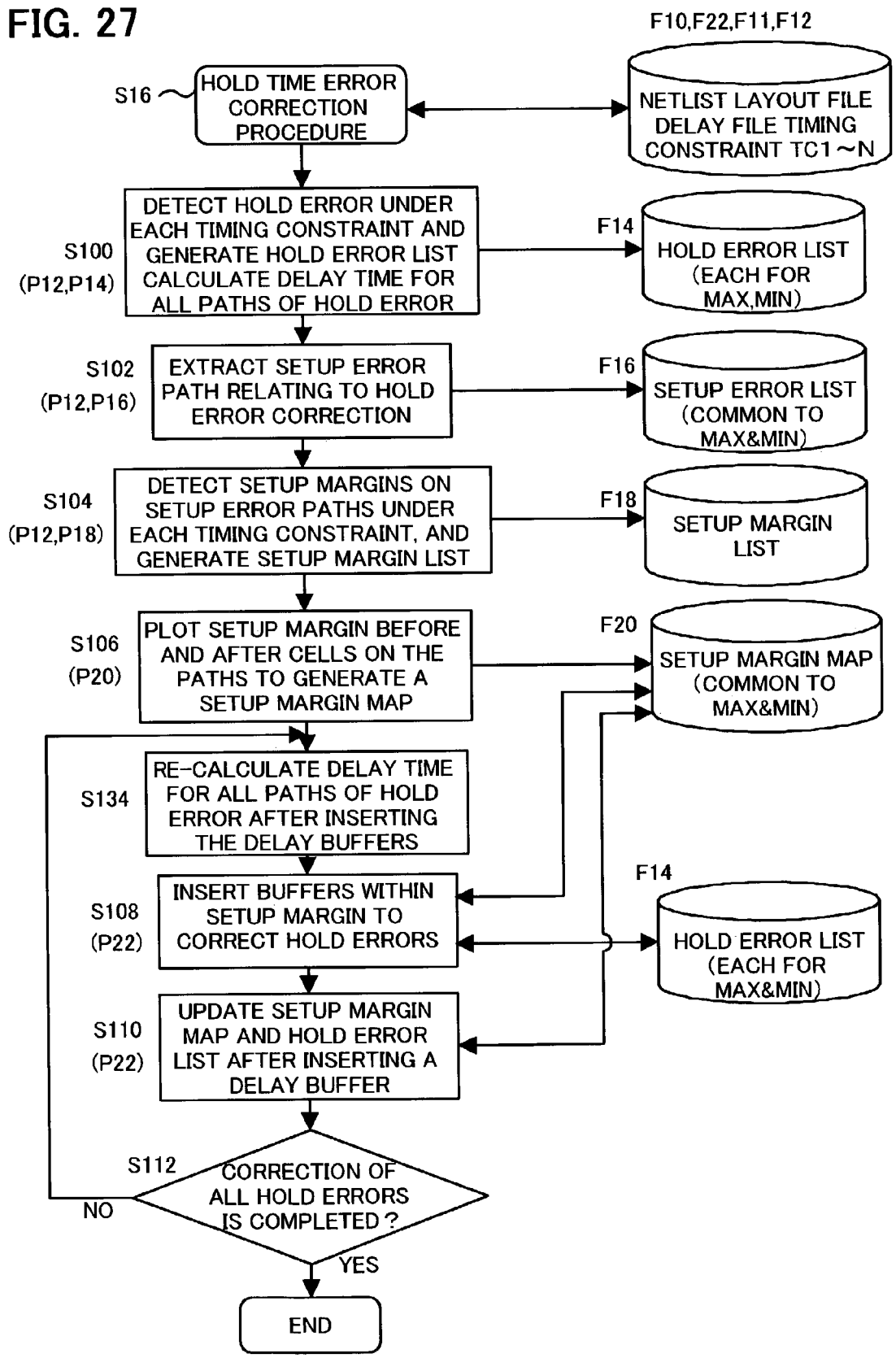
FIG. 27 is a modified flowchart of the hold error correction method shown in FIG. 6.

Further, FIG. 27 is another modification of the hold error correction shown in FIG. 6. The different portion of FIG. 27 from FIG. 6 is: it is added to calculate delay times of all paths having the hold error when the hold error list is generated at the step S100; and the step S134 is added. In the step S134, the delay time of paths changed upon inserting the delay buffer at the step S108 is re-calculated. If the difference between the original delay time calculated at the step S100 and the re-calculated delay time at the step S134 is grater than the hold error value, the hold error is already corrected. On the other hand, if the above difference is less than the hold error value, additional delay buffer having the delay time equal to the difference should be inserted to correct the hold error completely. Therefore, at the step S108, the above comparison between the delay time difference and the hold error value is performed, and a new delay buffer having a necessary delay time corresponding to the delay shortage is inserted in a path still having the hold error. In this procedure, although the hold error list is not updated, the delay time of all paths which are effected by the insertion of the delay buffers is checked so as to determine if the hold error is completely corrected or still exists.

Thus by means of this invention, hold time errors can be corrected while satisfying a plurality of timing constraints in the procedure for layout of the integrated circuit.

What is claimed is:

1. A hold time error correction method for integrated circuits, comprising:

generating, for an integrated circuit layout, a hold time error list that includes hold time error paths causing hold time errors which exist under a plurality of timing constraints, and a hold time error value for each hold time error path which satisfies said plurality of timing constraints as a result of correction;

detecting a setup time margin for said plurality of timing constraints, and generating a setup time margin list having setup time errors paths with the possibility of causing setup time errors as a result of correction of said hold time errors, and a setup time margin for each setup time error path which is common for said plurality of timing constraints;

generating a setup time margin map, in which the setup time margin of said setup time margin list is allocated to each path of said integrated circuit; and inserting a delay buffer, which, while referencing said setup time margin map, corrects the hold time error values of said hold time error list, within the range of a delay amount and position which satisfy said allocated setup time margin.

2. The hold time error correction method according to claim 1, wherein, in said inserting the delay buffer, the delay amount of said inserted delay buffer is subtracted from the setup time margin of the insertion position to perform updating, and another delay buffer to correct a hold time error value is inserted by referring to the updated setup time margin map.

3. The hold time error correction method according to claim 2, wherein, in said setup time margin updating, said subtracted delay buffer delay amount is the delay amount for a delay characteristic with a larger delay.

4. The hold time error correction method according to claim 1, wherein, in said generating the setup time margin list, generation of said setup time error path is performed by extracting a path, at least a portion of which is common to said hold time error path.

5. The hold time error correction method according to claim 1, wherein, in said generating the setup time margin list, generation of said setup time error path is performed by extracting a path having a setup time margin which is equal to or less than the maximum value of said hold time error values.

6. The hold time error correction method according to claim 1, wherein, in said generating the setup time margin list, the smallest value among the setup time margins for each of said plurality of timing constraints for a given setup time error path is selected as a setup time margin common to said plurality of timing constraints.

7. The hold time error correction method according to claim 1, wherein said setup time margin is detected for both a signal rising edge and a signal falling edge.

8. The hold time error correction method according to claim 7, wherein, the smallest value of the setup time margins for said signal rising edge and falling edge is selected as the setup time margin of said setup time margin map.

9. The hold time error correction method according to claim 1, wherein, in said inserting the delay buffer, the setup time margin in said setup time margin map is set to be smaller, by a prescribed ratio, than a setup time margin determined by a calculation.

10. The hold time error correction method according to claim 1, wherein, in said generating the hold time error list, the largest value among the hold time error values for each of said plurality of timing constraints for a given hold time error path is selected as a hold time error satisfying said plurality of timing constraints.

11. The hold time error correction method according to claim 1, wherein said hold time error list has a list a having hold time error value for a first delay characteristic with a larger delay, and a list a having hold time error value for a second delay characteristic with a delay smaller than said first delay characteristic.

12. The hold time error correction method according to claim 11, wherein, in said inserting the delay buffer, delay buffers are inserted so as to correct the hold time error values of both lists.

13. The hold time error correction method according to claim 12, wherein, in said inserting the delay buffer, insertion of delay buffer to correct the hold time error value for the second delay characteristic is given priority.

14. The hold time error correction method according to claim 1, wherein said hold time error list is generated for both a signal rising edge and a signal falling edge.

15. The hold time error correction method according to claim 14, wherein said setup time margin map is also generated for both the signal rising edge and the signal falling edge; and, in said inserting the delay buffer, when correcting a hold time error for said signal rising edge, the setup time margin map for said rising edge is referenced, and when correcting a hold time error for said signal falling edge, the setup time margin map for said falling edge is referenced.

16. The hold time error correction method according to claim 1, wherein, in said generating the hold time error list, the larger value of a hold time error value for a signal rising edge and a hold time error value for a signal falling edge is selected as said hold time error value.

17. The hold time error correction method according to claim 16, wherein a smaller value of a setup time margin for the signal rising edge and a setup time margin for the signal falling edge is selected as the setup time margin of said setup time margin map.

18. The hold time error correction method according to claim 1, wherein, in said inserting the delay buffer, selection of the insertion position of said delay buffer is performed giving priority to a position at which a plurality of hold time error paths overlap.

19. The hold time error correction method according to claim 1, wherein, in said generating the setup time margin map, said setup time margin is allocated to a logical cell position existing on said setup time error path.

20. The hold time error correction method according to claim 1, wherein, in said generating the setup time margin map, said setup time margin is allocated to a virtual point position set on said setup time error path.

21. A layout method for an integrated circuit, comprising:
arranging cells and wiring included in the integrated circuit, so as to satisfy setup times for at least the strictest timing constraint among a plurality of timing constraints; and
the hold time error correction method of claim 1,
wherein said delay buffer is included in the integrated circuit.

22. A computer program for performing correction of integrated circuit hold time error, which causes a computer to execute the hold time error correction method of claim 1.

23. A computer layout program for performing integrated circuit layout, which causes a computer to execute:
arranging cells and wiring included in the integrated circuit, so as to satisfy setup times for at least the strictest timing constraint among a plurality of timing constraints; and
the hold time error correction method of claim 1,
wherein said delay buffer is included in the integrated circuit.

* * * * *